(12) United States Patent
Bok et al.

(10) Patent No.: US 11,711,953 B2
(45) Date of Patent: Jul. 25, 2023

(54) DISPLAY PANEL AND DISPLAY APPARATUS INCLUDING THE SAME

(71) Applicant: Samsung Display Co., Ltd., Yongin-si (KR)

(72) Inventors: Seunglyong Bok, Yongin-si (KR); Okkyung Park, Yongin-si (KR); Youngran Son, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 188 days.

(21) Appl. No.: 17/207,420

(22) Filed: Mar. 19, 2021

(65) Prior Publication Data
US 2022/0069048 A1 Mar. 3, 2022

(30) Foreign Application Priority Data
Sep. 3, 2020 (KR) .................. 10-2020-0112545

(51) Int. Cl.
*H10K 59/131* (2023.01)
*G09G 3/3266* (2016.01)
*H10K 59/121* (2023.01)

(52) U.S. Cl.
CPC ......... *H10K 59/131* (2023.02); *G09G 3/3266* (2013.01); *H10K 59/121* (2023.02)

(58) Field of Classification Search
CPC ............... H01L 27/3276; H01L 27/326; H01L 27/3258; G09G 3/3266; G09G 3/3258; H10K 59/131; H10K 59/121
See application file for complete search history.

(56) References Cited

U.S. PATENT DOCUMENTS

| 8,193,017 | B2 | 6/2012 | Kim et al. |
| 8,796,702 | B2 | 8/2014 | Kim et al. |
| 8,872,206 | B2 | 10/2014 | Chung et al. |
| 8,890,181 | B2 | 11/2014 | Wang et al. |
| 10,229,964 | B2 | 3/2019 | Kim et al. |
| 10,263,211 | B2 * | 4/2019 | Byun .................. H01L 27/3272 |
| 10,290,694 | B2 * | 5/2019 | Xiang ................. H01L 27/3227 |
| 10,580,848 | B1 * | 3/2020 | Ma ...................... H01L 27/3216 |
| 10,825,886 | B2 * | 11/2020 | Na ....................... H01L 27/3227 |
| 2012/0104422 | A1 | 5/2012 | Lee et al. |
| 2014/0145156 | A1 | 5/2014 | Choi et al. |
| 2020/0013834 | A1 | 1/2020 | Park et al. |
| 2021/0066427 | A1 * | 3/2021 | Ma ........................ H01L 27/156 |
| 2021/0193758 | A1 * | 6/2021 | Choi .................... H01L 27/3248 |

FOREIGN PATENT DOCUMENTS

| CN | 109087938 A | 12/2018 |
| CN | 109840475 A | 6/2019 |
| CN | 109979391 A | 7/2019 |

(Continued)

*Primary Examiner* — Sardis F Azongha
(74) *Attorney, Agent, or Firm* — Lewis Roca Rothgerber Christie LLP

(57) ABSTRACT

A display panel includes: a substrate including a main display area, a first component area, a second component area, and a peripheral area; a first subpixel on the main display area, and a first pixel circuit connected to the first subpixel; a second subpixel on the first component area; a second pixel circuit spaced apart from the second subpixel; and a connection wiring connecting the second subpixel to the second pixel circuit.

19 Claims, 34 Drawing Sheets

(56) References Cited

FOREIGN PATENT DOCUMENTS

| | | | |
|---|---|---|---|
| CN | 110379356 | A | 10/2019 |
| CN | 110649180 | A | 1/2020 |
| CN | 111028692 | A | 4/2020 |
| CN | 111063719 | A | 4/2020 |
| KR | 10-1108170 | B1 | 1/2012 |
| KR | 10-2018-0096875 | A | 8/2018 |
| KR | 10-2020-0005706 | A | 1/2020 |

* cited by examiner

DISPLAY PANEL AND DISPLAY APPARATUS INCLUDING THE SAME

CROSS-REFERENCE TO RELATED APPLICATION

The present application claims priority to and the benefit of Korean Patent Application No. 10-2020-0112545, filed on Sep. 3, 2020, in the Korean Intellectual Property Office, the entire disclosure of which is incorporated herein by reference.

BACKGROUND

1. Field

Aspects of one or more example embodiments relate to a display panel and a display apparatus including the display panel.

2. Description of Related Art

Recently, the various uses and applications for display apparatuses has become more diversified. Also, as display apparatuses have become thinner and more lightweight, their range of use has widened.

As display apparatuses are used for various purposes, there are various methods of designing the display apparatuses of various shapes, and the number of functions to be combined with or linked to display apparatuses has increased.

The above information disclosed in this Background section is only for enhancement of understanding of the background and therefore the information discussed in this Background section does not necessarily constitute prior art.

SUMMARY

Aspects of one or more example embodiments include a display panel with a display area extended to display an image even in an area where a component as an electronic element is arranged, and a display apparatus including the display panel. However, the one or more embodiments are only examples, and the scope of embodiments according to the present disclosure are not limited thereto.

Additional aspects will be set forth in part in the description which follows and, in part, will be apparent from the description, or may be learned by practice of the presented embodiments of the disclosure According to one or more example embodiments, a display panel includes a substrate including a main display area, a first component area, a second component area, and a peripheral area, a first subpixel on the main display area, and a first pixel circuit connected to the first subpixel, a second subpixel on the first component area, a second pixel circuit spaced apart from the second subpixel, and a connection wiring connecting the second subpixel to the second pixel circuit.

According to some example embodiments, the second pixel circuit may be located in the peripheral area.

According to some example embodiments, the connection wiring may include a transparent conductive material.

According to some example embodiments, the display panel may further include an additional connection wiring connecting the connection wiring to the second pixel circuit, and the additional connection wiring may include a material different from a material of the connection wiring.

According to some example embodiments, the first subpixel and the second subpixel may emit the same color, and a size of the second subpixel may be greater than a size of the first subpixel.

According to some example embodiments, the second pixel circuit may be between the first component area and the second component area.

According to some example embodiments, the display panel may further include a third subpixel between the first component area and the second component area.

According to some example embodiments, the third subpixel may be connected to a third pixel circuit arranged in the peripheral area.

According to some example embodiments, the display panel may further include a main scan line extending in a first direction, and a scan connection line connected to the main scan line.

According to some example embodiments, the scan connection line may surround one side of the first component area.

According to some example embodiments, the scan connection line may be in the peripheral area.

According to some example embodiments, the first subpixel may include a first pixel electrode and a first emission layer, and the second subpixel may include a second pixel electrode and a second emission layer.

According to some example embodiments, the display panel may further include an opposite electrode on each of the first emission layer and the second emission layer, and an upper layer on the opposite electrode. An end of the opposite electrode and an end of the upper layer may coincide with each other.

According to some example embodiments, the first pixel electrode or the second pixel electrode and the connection wiring may be formed by the same process.

According to some example embodiments, the display panel may further include a bottom metal layer on the first component area.

According to some example embodiments, the display panel may further include a dummy subpixel located inbetween the peripheral area or the first component area and the second component area.

According to some example embodiments, the substrate may further include a third component area.

According to one or more example embodiments, a display apparatus includes a display panel including a substrate, the substrate including a main display area, a first component area, a second component area, and a peripheral area, a first component below the display panel to correspond to the first component area, and a second component below the display panel to correspond to the second component area, wherein the display panel includes a first subpixel on the main display area, and a first pixel circuit connected to the first subpixel, a second subpixel on the first component area, a second pixel circuit spaced apart from the second subpixel, and a connection wiring connecting the second subpixel to the second pixel circuit.

According to some example embodiments, the first component and the second component may each include at least one of a proximity sensor, an illuminance sensor, an RGB sensor, an infrared sensor, a fingerprint recognition sensor, an ultrasonic sensor, an optical sensor, a microphone, an environmental sensor, a chemical sensor, or a radar sensor.

According to some example embodiments, the substrate may further include a third component area, and the display apparatus may further include a third component arranged to correspond to the third component area.

Other aspects, features, and characteristics other than those described above will become apparent from the following detailed description, claims and drawings for carrying out the disclosure.

BRIEF DESCRIPTION OF THE DRAWINGS

The above and other aspects, features, and characteristics of certain example embodiments of the disclosure will be more apparent from the following description taken in conjunction with the accompanying drawings, in which.

DETAILED DESCRIPTION

Figure 1:
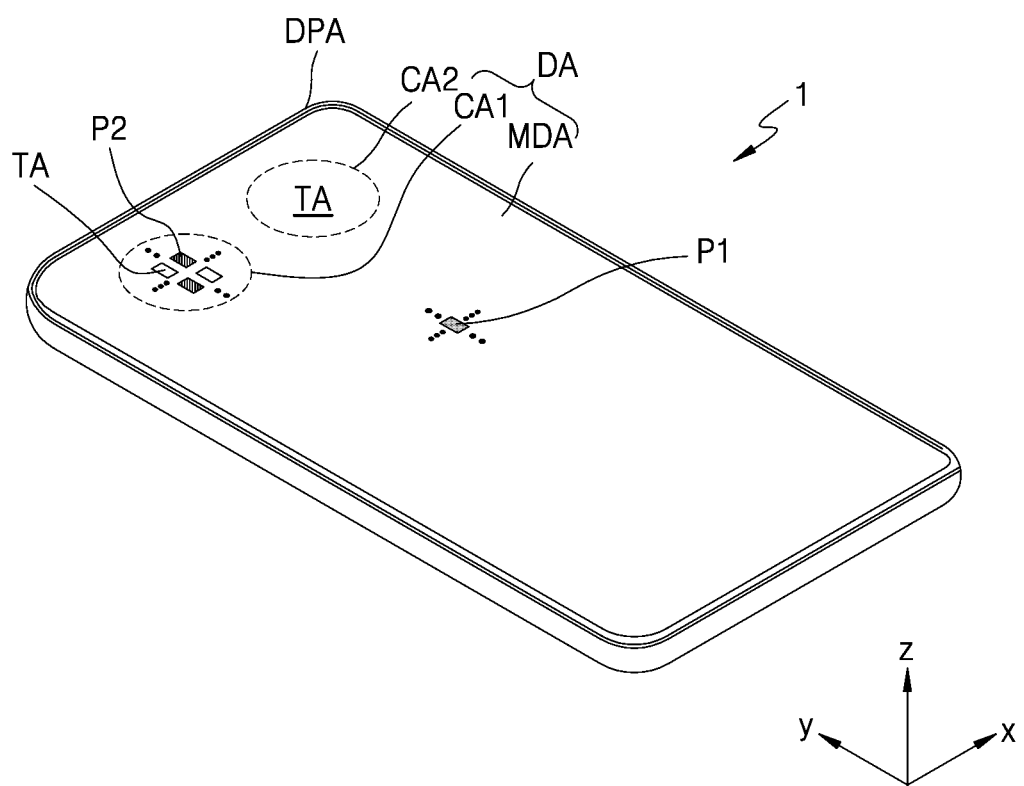
FIG. 1 is a perspective view schematically illustrating a display apparatus according to some example embodiments.

Reference will now be made in more detail to aspects of some example embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, certain embodiments will be illustrated in the drawings and described in detail in the written description. The attached drawings for illustrating embodiments of the present disclosure are referred to in order to gain a sufficient understanding of the present disclosure, the merits thereof, and the objectives accomplished by the implementation of the present disclosure. The disclosure may, however, be embodied in many different forms and should not be construed as being limited to the embodiments set forth herein.

Hereinafter, aspects of some example embodiments will be described in more detail with reference to the accompanying drawings. When describing embodiments with reference to the accompanying drawings, the same or corresponding elements are denoted by the same reference numerals and a redundant description thereof will be omitted.

It will be understood that when a component, such as a layer, a film, a region, or a plate, is referred to as being "on" another component, the component can be directly on the other component or intervening components may be present thereon. Sizes of elements in the drawings may be exaggerated for convenience of description. For example, because sizes and thicknesses of components in the drawings are arbitrarily illustrated for convenience of explanation, the following embodiments are not limited thereto.

In the following embodiments, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a perspective view schematically illustrating a display apparatus 1 according to some example embodiments.

Referring to FIG. 1, the display apparatus 1 may include a display area DA and a peripheral area DPA outside the display area DA. The display area DA may include a first component area CA1 and a main display area MDA at least partially surrounding the first component area CA1. That is, the first component area CA1 and the main display area MDA may display an image individually or together. The peripheral area DPA may be a type of non-display area in which display elements are not arranged. The display area DA may be entirely surrounded by the peripheral area DPA.

According to some example embodiments, FIG. 1 shows that two component areas, that is, first and second component areas CA1 and CA2 are in the main display area MDA. According to some example embodiments, the display apparatus 1 may include three or more component areas, and shapes and sizes of the plurality of component areas may be different from one another. In a view in a direction substantially perpendicular to the upper surface of the display apparatus 1, the component area may have various shapes such as circular shapes, elliptical shapes, and polygonal shapes such as tetragonal shapes, star shapes, or diamond shapes. In addition, FIG. 1 illustrates that the component area is at the upper center (in the +y direction) of the main display area MDA having a substantially rectangular shape in a view in a direction substantially perpendicular to the upper surface of the display apparatus 1; however, the component area may be at one side of the main display area MDA having a rectangular shape, for example, at the upper right side or the upper left side thereof.

The display apparatus 1 may provide an image by using first subpixels P1 in the main display area MDA and second subpixels P2 in the first component area CA1. According to some example embodiments, subpixels may not be in the second component area CA2. According to some example embodiments, subpixels may be also in the second component area CA2.

As described below with reference to FIG. 2A, a component 40 as an electronic element may be below a display panel to correspond to the first component area CA1. The component 40 may include at least one of a proximity sensor, an illuminance sensor, an RGB sensor, an infrared sensor, a fingerprint recognition sensor, an ultrasonic sensor, an optical sensor, a microphone, an environmental sensor, a chemical sensor, or a radar sensor. In order to minimize or reduce the limitation of the function of the component 40, the first component area CA1 may include a transmission area TA that may transmit light and/or sound output from the component 40 to the outside or propagating toward the component 40 from the outside. According to some example embodiments, when light is transmitted through the first component area CA1, the light transmittance thereof may be about 10% or more, for example, about 40% or more, about 25% or more, about 50% or more, about 85% or more, or about 90% or more.

A component 40, which is an electronic element, may be below the display panel to correspond to the second component area CA2.

According to some example embodiments, an optical sensor such as a camera may be below the first component area CA1 in which a subpixel is provided, and a high-resolution sensor such as a radar sensor may be below the second component area CA2 in which no subpixel is provided.

The second subpixels P2 may be in the first component area CA1. The second subpixels P2 may emit light to provide a certain image. The image displayed in the first component area CA1 may be an auxiliary image and may have a lower resolution than an image displayed in the main display area MDA. That is, the first component area CA1 may include a transmission area TA through which light and sound may be transmitted. When no subpixel is in the transmission area TA, the number of second subpixels P2 that may be arranged per unit area therein may be less than the number of first subpixels P1 arranged per unit area in the main display area MDA.

According to some example embodiments, the second subpixels P2 may also be in the second component area CA2. The second subpixels P2 may each emit light to provide a certain image. The image displayed in the second component area CA2 is an auxiliary image and may have a lower resolution than the image displayed in the main display area MDA. That is, the second component area CA2 may include a transmission area TA through which light and sound may be transmitted. When no subpixel is in the transmission area TA, the number of second subpixels P2 that may be arranged per unit area therein may be less than the number of first subpixels P1 arranged per unit area in the main display area MDA.

Figure 2A:
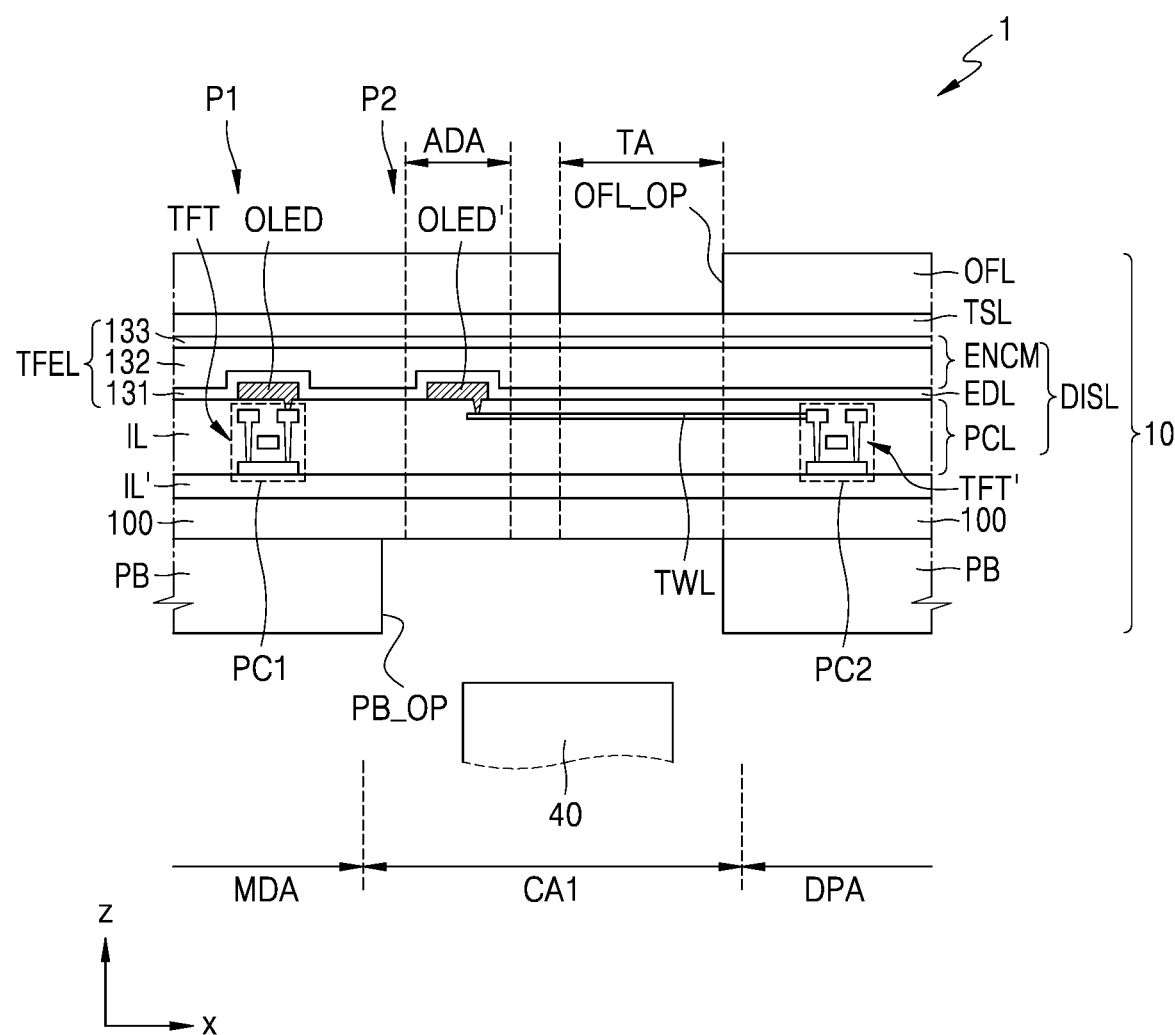
FIGS. 2A and 2B are cross-sectional views each schematically illustrating a portion of a cross-section of a display apparatus according to some example embodiments.
Figure 2B:
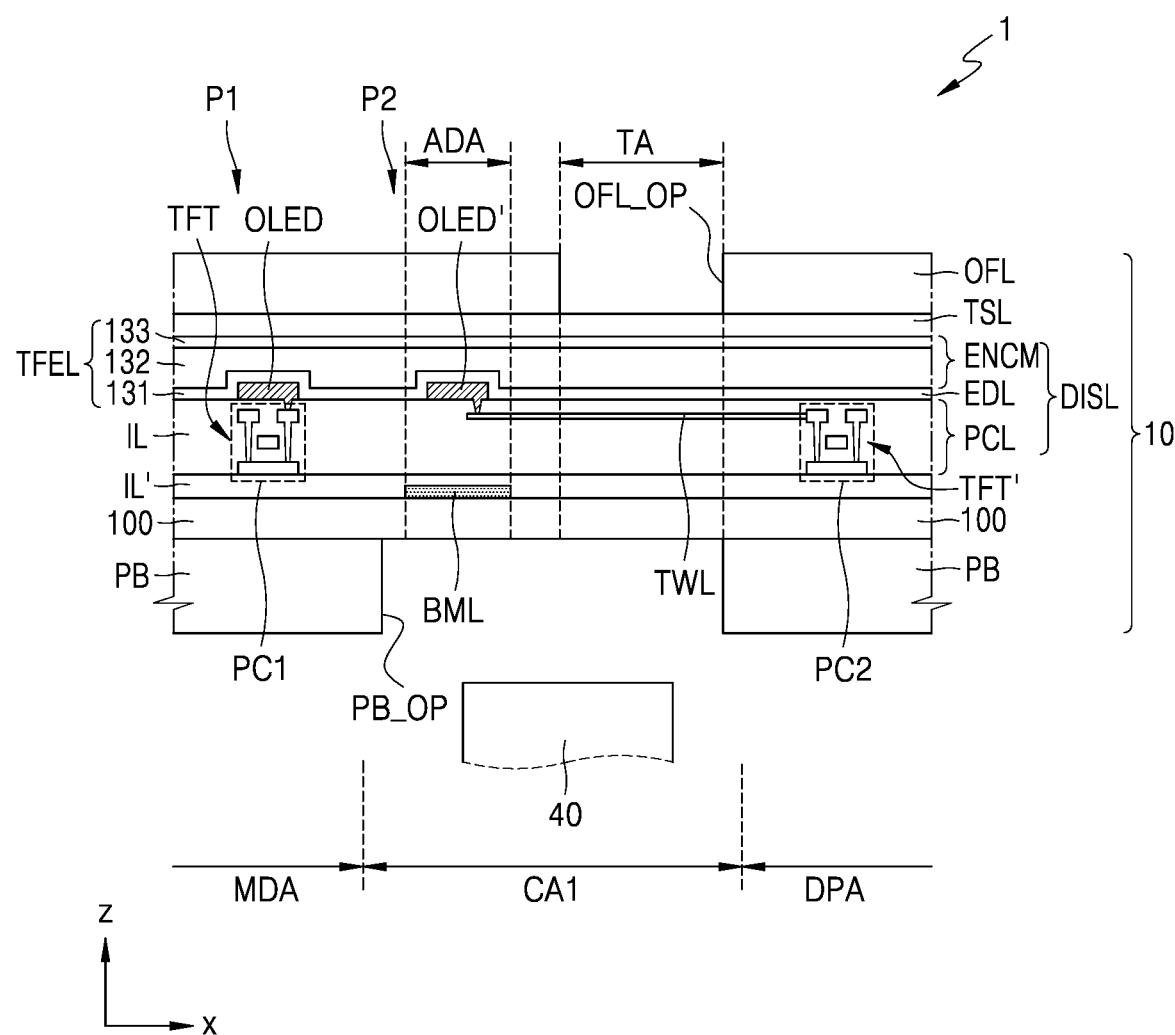

FIGS. 2A and 2B are cross-sectional views each schematically illustrating a portion of a cross-section of the display apparatus 1 according to some example embodiments.

Referring to FIG. 2A, the display apparatus 1 may include a display panel 10 and the component 40 overlapping the display panel 10. A cover window for protecting the display panel 10 may be further above the display panel 10.

The display panel 10 may include a first component area CA1 overlapping the component 40 and a main display area MDA, where a main image is displayed. The display panel 10 may include a substrate 100, a display layer DISL on the substrate 100, a touch screen layer TSL, an optical functional layer OFL, and a panel protection member PB below the substrate 100. According to some example embodiments, it may be understood that the substrate 100 included in the display panel 10 includes the first component area CA1 and the main display area MDA, where a main image is displayed.

The display layer DISL may include a circuit layer PCL including thin-film transistors TFT and TFT', a display element layer EDL including organic light-emitting diodes OLED and OLED' as a display element, and an encapsulation member ENCM such as a thin-film encapsulation layer TFEL or a sealing substrate. Insulating layers IL and IL' may be in the display layer DISL and between the substrate 100 and the display layer DISL.

The substrate 100 may include an insulating material such as glass, quartz, or polymer resin. The substrate 100 may include a rigid substrate or a flexible substrate that is bendable, foldable, or rollable.

A first pixel circuit PC1 and a main organic light-emitting diode OLED connected thereto may be in the main display area MDA of the display panel 10. The first pixel circuit PC1 includes at least one thin-film transistor TFT, and may control emission of the main organic light-emitting diode OLED. The first subpixel P1 may be implemented by emission of the main organic light-emitting diode OLED.

An auxiliary organic light-emitting diode OLED' may be in the first component area CA1 of the display panel 10 to implement the second subpixel P2. According to some example embodiments, the second pixel circuit PC2 driving the auxiliary organic light-emitting diode OLED' may not be in the first component area CA1, but may be in a peripheral area DPA, which is a non-display area. According to some example embodiments, the second pixel circuit PC2 may be in the main display area MDA or may be between the first component area CA1 and the second component area CA2 (see FIG. 1). The second pixel circuit PC2 may be in various locations. That is, the second pixel circuit PC2 may not overlap the auxiliary organic light-emitting diode OLED'.

The second pixel circuit PC2 includes at least one auxiliary thin-film transistor TFT', and may be electrically connected to the auxiliary organic light-emitting diode OLED' by a connection wiring TWL. The connection wiring TWL may include a transparent conductive material. The second pixel circuit PC2 may control emission of the auxiliary organic light-emitting diode OLED'. The second subpixel P2 may be implemented by emission of the auxiliary organic light-emitting diode OLED'. An area in which the auxiliary organic light-emitting diode OLED' is arranged in the first component area CA1 may be referred to as an auxiliary display area ADA.

In addition, an area in which the auxiliary organic light-emitting diode OLED', which is a display element, is not arranged in the first component area CA1 may be referred to as a transmission area TA. The transmission area TA may be an area through which light or a signal emitted from the component 40 arranged to correspond to the first component area CA1 or light or a signal incident on the component 40 is transmitted. The auxiliary display area ADA and the transmission area TA may be alternately arranged in the first component area CA1. The connection wiring TWL connecting the second pixel circuit PC2 to the auxiliary organic light-emitting diode OLED' may be in the transmission area TA. The connection wiring TWL may include a transparent conductive material having a high transmittance, and thus, the transmittance of the transmission area TA may be secured, even when the connection wiring TWL is in the transmission area TA.

Because the second pixel circuit PC2 is not in the first component area CA1, an area of the transmission area TA may be secured, and thus, the light transmittance thereof may be further improved.

The display element layer EDL may be covered by the thin-film encapsulation layer TFEL or may be covered by a sealing substrate. In some embodiments, the thin-film encapsulation layer TFEL may include at least one inorganic film layer and at least one organic film layer as shown in FIG. 2. According to some example embodiments, the thin-film encapsulation layer TFEL may include a first inorganic film layer 131, a second inorganic film layer 133, and an organic film layer 132 therebetween.

The first inorganic film layer 131, and the second inorganic film layer 133 may include one or more inorganic insulating materials such as silicon oxide ($SiO_2$), silicon nitride ($SiN_X$), silicon oxynitride ($SiO_XN_Y$), aluminum oxide ($Al_2O_3$), titanium oxide ($TiO_2$), tantalum oxide ($Ta_2O_5$), and may be formed by chemical vapor deposition (CVD) or the like. The organic film layer 132 may include a polymer-based material. The polymer-based material may include a silicon-based resin, an acryl-based resin, an epoxy-based resin, polyimide, polyethylene, and the like.

The first inorganic film layer 131, the organic film layer 132, and the second inorganic film layer 133 may be integrally formed to cover the main display area MDA and the first component area CA1. Further, according to some example embodiments, the first inorganic film layer 131, the organic film layer 132, and the second inorganic film layer 133 may also cover the second component area CA2 (see FIG. 1).

When the display element layer EDL is sealed by the sealing substrate, the sealing substrate may face the substrate 100 with the display element layer EDL therebetween. There may be a gap between the sealing substrate and the display element layer EDL. The sealing substrate may include glass. A sealant including frit or the like may be between the substrate 100 and the sealing substrate, and the sealant may be in the peripheral area DPA described above. The sealant in the peripheral area DPA may surround the display area DA to prevent moisture from penetrating through the side surface thereof.

The touch screen layer TSL may be configured to obtain coordinate information according to an external input, for example, a touch event. The touch screen layer TSL may include a touch electrode and touch wirings connected to the touch electrode. The touch screen layer TSL may sense an external input by using a self capacitance method or a mutual capacitance method.

The touch screen layer TSL may be formed on the thin-film encapsulation layer TFEL. Alternatively, the touch screen layer TSL may be separately formed on a touch substrate, and then, may be coupled onto the thin-film encapsulation layer TFEL through an adhesive layer such as an optical clear adhesive (OCA). According to some example embodiments, the touch screen layer TSL may be directly formed on the thin-film encapsulation layer TFEL, and in this case, an adhesive layer may not be between the touch screen layer TSL and the thin-film encapsulation layer TFEL.

The optical functional layer OFL may include an anti-reflection layer. The anti-reflection layer may reduce the reflectance of light (external light) incident from the outside toward the display apparatus 1.

According to some example embodiments, the optical functional layer OFL may include a polarization film. The optical functional layer OFL may include an opening OFL_OP corresponding to the transmission area TA. Accordingly, the light transmittance of the transmission area TA may be significantly improved. The opening OFL_OP may be filled with a transparent material such as optically clear resin (OCR).

According to some example embodiments, the optical functional layer OFL may be provided as a filter plate including a black matrix and color filters.

The panel protection member PB may be attached under the substrate 100 to support and protect the substrate 100. The panel protection member PB may include an opening PB_OP corresponding to the first component area CA1. By providing the opening PB_OP in the panel protection member PB, the light transmittance of the first component area CA1 may be improved. The panel protection member PB may include polyethylene terephthalate or polyimide. According to some example embodiments, the panel protection member PB may include an opening corresponding to the second component area CA2 (see FIG. 1). By providing the opening PB_OP in the panel protection member PB, the light transmittance of the second component area CA2 may be improved.

An area of the first component area CA1 may be greater than an area where the component 40 is arranged. Accordingly, an area of the opening PB_OP in the panel protection member PB may not coincide with the area of the first component area CA1.

In addition, a plurality of components 40 may be in the first component area CA1. The plurality of components 40 may have different functions. For example, the plurality of components 40 may include at least two of a camera (an imaging device), a solar cell, a flash, a proximity sensor, an illuminance sensor, and an iris sensor.

In FIG. 2A, the bottom metal layer BML is not arranged below the auxiliary organic light-emitting diode OLED' of the first component area CA1, but as shown in FIG. 2B, the display apparatus 1 may include a bottom metal layer BML that overlaps the auxiliary organic light-emitting diode OLED'.

The bottom metal layer BML may be between the substrate 100 and the auxiliary organic light-emitting diode OLED' and may overlap the auxiliary organic light-emitting diode OLED'. The bottom metal layer BML may block the external light from reaching the auxiliary organic light-emitting diode OLED'. Meanwhile, the bottom metal layer BML may be formed to correspond to the entire auxiliary display area ADA, and may include a lower-hole corresponding to the transmission area TA. In this case, the lower-hole may be provided in various shapes such as a polygonal, a circular, or an amorphous shape, and may adjust the diffraction characteristic of external light.

Figure 3A:
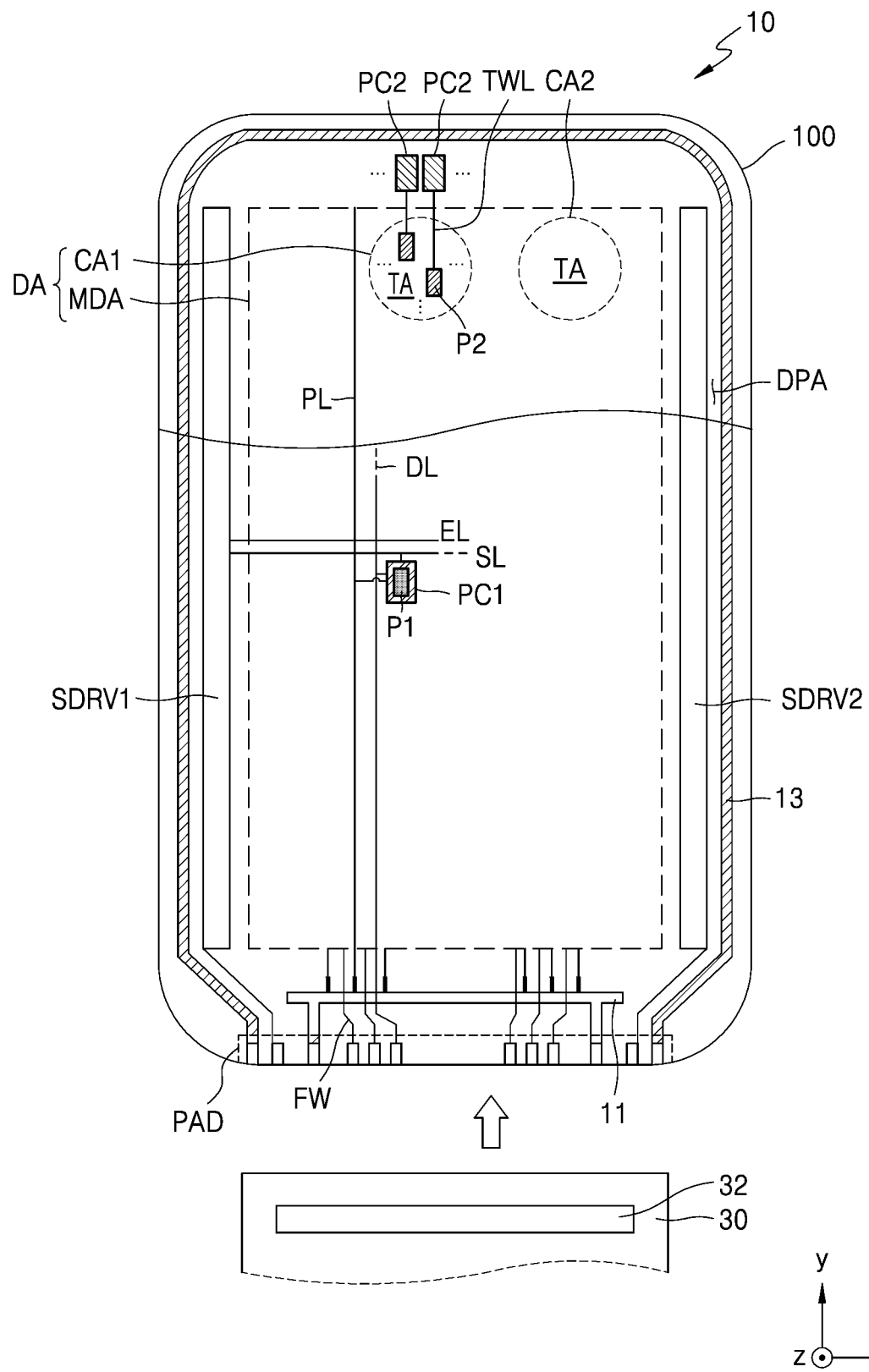
FIGS. 3A and 3B are plan views each schematically illustrating a display panel that may be included in the display apparatus of FIG. 1 according to some example embodiments.
Figure 3B:
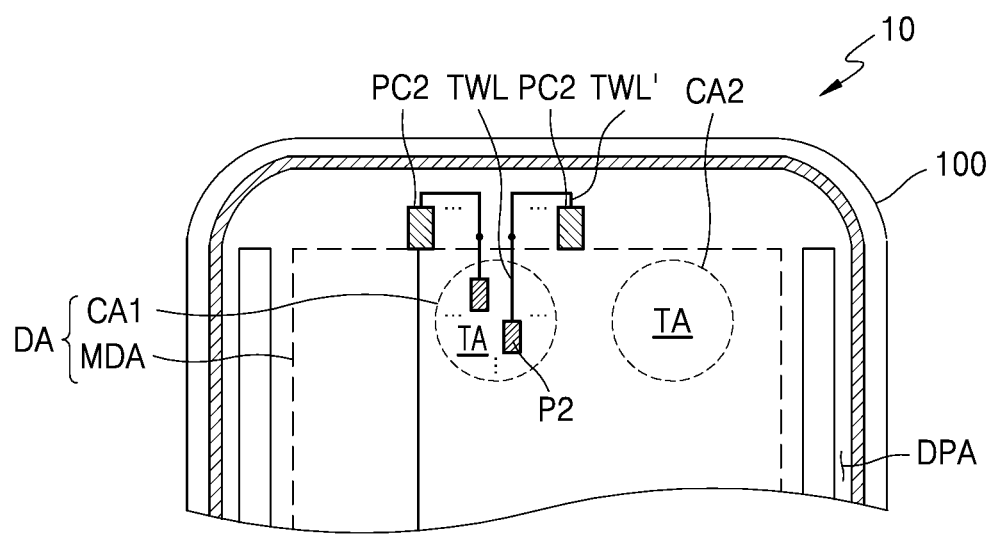

FIGS. 3A and 3B are plan views each schematically illustrating a display panel 10 that may be included in the display apparatus 1 of FIG. 1 according to some example embodiments.

Referring to FIG. 3A, various components included in the display panel 10 may be on the substrate 100. The substrate 100 may include a display area DA and a peripheral area DPA surrounding the display area DA. The display area DA may include a main display area MDA, where a main image is displayed, and a first component area CA1, which includes a transmission area TA and in which an auxiliary image is displayed. The auxiliary image may form a full image together with the main image, and the auxiliary image may form an image independent from the main image. Further, the substrate 100 may include a second component area CA2. The second component area CA2 may also include a transmission area TA. According to some example embodiments, the first component area CA1 and the second component area CA2 may be spaced apart in a first direction (the x-direction). According to some example embodiments, the first component area CA1 and the second component area CA2 may be spaced apart in a second direction (the y-direction) intersecting with the first direction (the x-direction).

First subpixels P1 may be in the main display area MDA. Each of the first subpixels P1 may be implemented by a display element such as an organic light-emitting diode OLED. A first pixel circuit PC1 driving the first subpixel P1 is in the main display area MDA, and may overlap the first subpixel P1. Each first subpixel P1 may emit, for example, red, green, blue, or white light. The main display area MDA may be covered with an encapsulation member to be protected from ambient air or moisture.

The first component area CA1 may be at one side of the main display area MDA as described above or may be inside the main display area MDA and surrounded by the main display area MDA. Second subpixels P2 may be in the first component area CA1. Each of the second subpixels P2 may be implemented by a display element such as an organic light-emitting diode. A second pixel circuit PC2 driving the second subpixel P2 may be in the peripheral area DPA that is close to the first component area CA1. For example, when the first component area CA1 is above the main display area MDA, the second pixel circuit PC2 may be above the peripheral area DPA. The second pixel circuit PC2 and a display element implementing the second subpixel P2 may be connected to each other by a connection wiring TWL extending in a second direction (the y-direction).

Each second subpixel P2 may emit, for example, red, green, blue, or white light. The first component area CA1 may be covered with an encapsulation member to be protected from ambient air or moisture.

Meanwhile, the first component area CA1 may include the transmission area TA. The transmission area TA may surround a plurality of second subpixels P2. Alternatively, the transmission area TA may be arranged in a grid form with the second subpixels P2.

The second component area CA2 may be spaced apart from the first component area CA1 in the first direction (the x-direction). According to some example embodiments, the second subpixels P2 may not be in the second component area CA2. According to some example embodiments, the second subpixels P2 may be in the second component area CA2. The second component area CA2 may include the transmission area TA.

Because the first component area CA1 includes the transmission area TA, a resolution of the component area CA may be less than a resolution of the main display area MDA. For example, the resolution of the first component area CA1 may be about ½, ⅜, ⅓, ¼, ⅔, ⅛, ⅑, or ¹⁄₁₆ that of the resolution of the main display area MDA. For example, the resolution of the main display area MDA may be about 400 ppi or more, and the resolution of the first component area CA1 may be about 200 ppi or about 100 ppi.

The pixel circuits driving the first and second subpixels P1 and P2 may be electrically connected to the peripheral circuits arranged in the peripheral area DPA, respectively. A first scan driving circuit SDRV1, a second scan driving circuit SDRV2, a terminal unit PAD, a driving voltage supply line 11, and a common voltage supply line 13 may be in the peripheral area DPA.

The first scan driving circuit SDRV1 may apply a scan signal to each of the first pixel circuits PC1 driving the first subpixels P1, through a scan line SL. The first scan driving circuit SDRV1 may apply an emission control signal to each pixel circuit through an emission control line EL. The second scan driving circuit SDRV2 may be on the opposite side of the first scan driving circuit SDRV1 with respect to the main display area MDA and may be substantially parallel to the first scan driving circuit SDRV1. Some of the pixel circuits of the first subpixels P1 of the main display area MDA may be electrically connected to the first scan driving circuit SDRV1, and the other ones may be electrically connected to the second scan driving circuit SDRV2.

The terminal unit PAD may be at one side of the substrate 100. The terminal unit PAD may be exposed by not being covered by an insulating layer, to be connected to a display circuit board 30. A display driver 32 may be on the display circuit board 30.

The display driver 32 may generate a control signal transmitted to the first scan driving circuit SDRV1 and the second scan driving circuit SDRV2. The display driver 32 may generate a data signal, and the generated data signal may be transmitted to the first pixel circuits PC1 through a fan-out wiring FW and a data line DL connected to the fan-out wiring FW.

The display driver 32 may apply a driving voltage ELVDD to the driving voltage supply line 11 and may apply a common voltage ELVSS to the common voltage supply line 13. The driving voltage ELVDD may be applied to the pixel circuit of the first and second subpixels P1 and P2 through a driving voltage line PL connected to the driving voltage supply line 11, and the common voltage ELVSS may be connected to the common voltage supply line 13 to be applied to an opposite electrode of the display element.

The driving voltage supply line 11 may extend in the first direction (the x-direction) below the main display area MDA. The common voltage supply line 13 may have a shape in which one side is open in a loop shape, to partially surround the main display area MDA.

In FIG. 3A, two component areas CA1 and CA2 are shown, but two or more component areas may be provided. In this case, a plurality of component areas are spaced apart from each other, and cameras or sensors may be selectively arranged to correspond to each component area.

According to some example embodiments, the first and second component areas CA1 and CA2 may be in a circular, elliptical, polygonal, or irregular shape. According to some example embodiments, each of the first and second component areas CA1 and CA2 may be in an octagonal shape. The first and second component areas CA1 and CA2 may be in polygons of various shapes, such as a square and a hexagon. The first and second component areas CA1 and CA2 may be surrounded by the main display area MDA.

In addition, in FIG. 3A, the second pixel circuit PC2 is spaced apart from the first component area CA1 in a second direction (the y-direction) in the peripheral area DPA, but embodiments are not limited thereto. As shown in FIG. 3B, the second pixel circuit PC2 is spaced diagonally from the first component area CA1 and may be arranged in the peripheral area DPA. According to some example embodiments, the connection wiring TWL may be connected to the second pixel circuit PC2 by an additional connection wiring TWL'. In this case, the connection wiring TWL may be in the first component area CA1, and the additional connection wiring TWL' may be in the peripheral area DPA. The connection wiring TWL may include a transparent conductive material, and the additional connection wiring TWL' may include a highly conductive metal. According to some example embodiments, the additional connection wiring TWL' may be on the same layer as the connection wiring TWL. According to some example embodiments, the additional connection wiring TWL' may be on a different layer from the connection wiring TWL and connected to the connection wiring TWL via a contact hole.

According to some example embodiments, when the second subpixels P2 are in the second component area CA2, the corresponding second pixel circuit PC2 may be in the peripheral area DPA adjacent to the second component area CA2.

Figure 4:
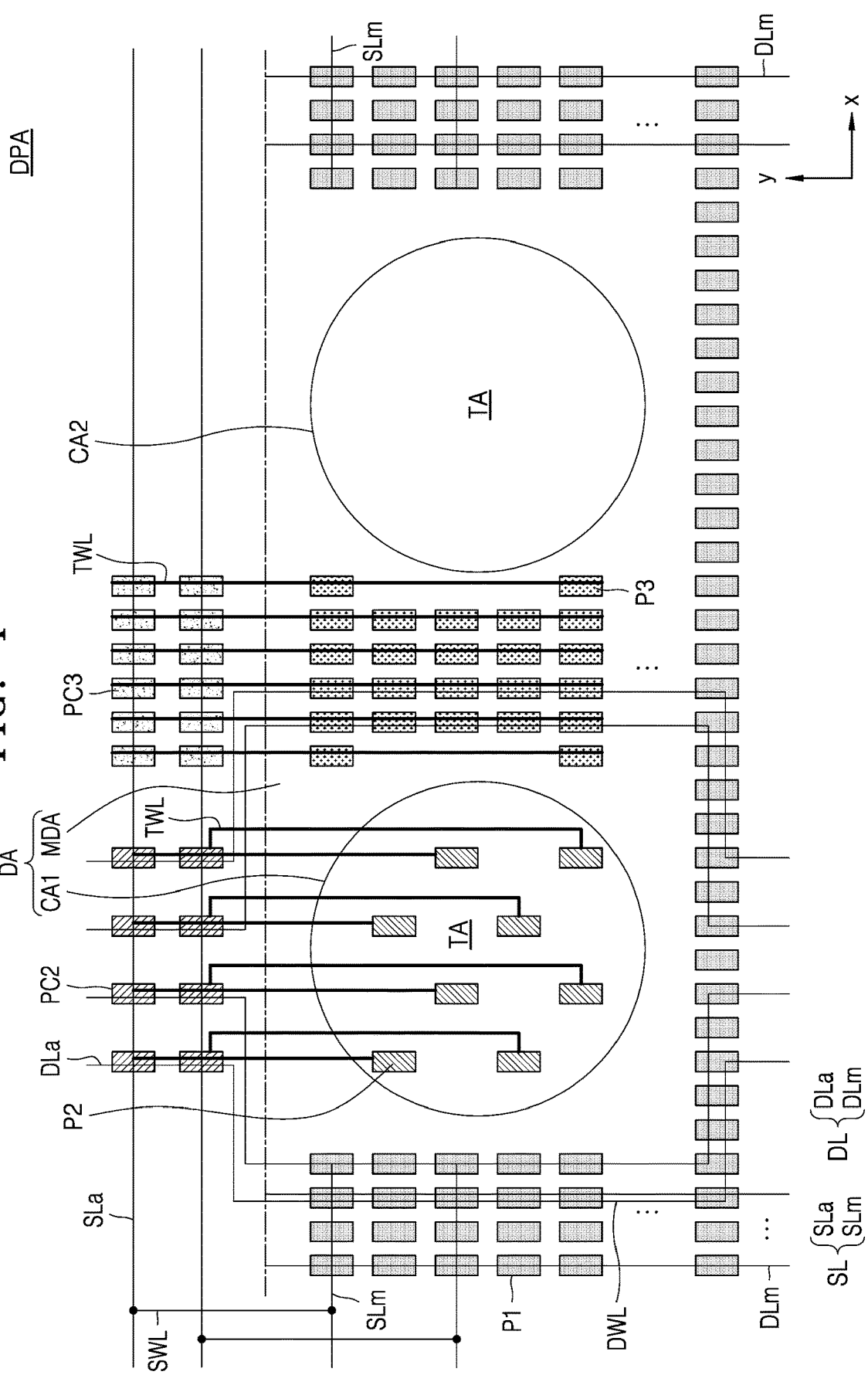
FIG. 4 is a schematic plan layout diagram illustrating a partial area of a display panel according to some example embodiments.

FIG. 4 is a schematic plan layout diagram illustrating a partial area of a display panel according to some example embodiments. For example, FIG. 4 shows a first component area CA1, a second component area CA2, a portion of a main display area MDA, and a portion of a peripheral area DPA.

Referring to FIG. 4, first subpixels P1 may be in the main display area MDA. The term "subpixel" used herein refers to an emission area from which light is emitted by a display element, as a minimum unit implementing an image. When an organic light-emitting diode is used as a display element, the emission area may be defined by an opening of a pixel-defining layer. This will be described later below. Each of the first subpixels P1 may emit red, green, blue, or white light.

In FIG. 4, the first subpixels P1 are arranged in a rectangular shape, but this is for convenience of explanation and illustration, and the first subpixels P1 may be arranged in various shapes, such as a pentile matrix structure, a stripe structure, a mosaic array structure, and a delta array structure.

In the main display area MDA, first pixel circuits PC1 may overlap the first subpixels P1, respectively, and may be arranged in the first direction (the x-direction) and the second direction (the y-direction). In this specification, the first pixel circuit PC1 refers to a unit of a pixel circuit that implements one first subpixel P1.

Second subpixels P2 may be in the first component area CA1. Each of the second subpixels P2 may emit red, green, blue, or white light.

The number of second subpixels P2 per unit area of the first component area CA1 may be less than the number first subpixels P1 per unit area of the main display area MDA. For example, the number of second subpixels P2 and the number of first subpixels P1 arranged per the same area may be in a ratio of 1:2, 1:4, 1:8, and 1:9. That is, a resolution of the first component area CA1 may be ½, ¼, ⅛, ⅑ that of a resolution of the main display area MDA.

The second subpixels P2 in the first component area CA1 may be arranged in various shapes. Some second subpixels P2 may collectively form a pixel group, and the second subpixels P2 may be arranged in various shapes, such as a pentile structure, a stripe structure, a mosaic array structure, and a delta array structure, within the pixel group. In this case, a distance between the second subpixels P2 in the pixel group may be the same as a distance between the first subpixels P1.

Alternatively, as shown in FIG. 4, the second subpixels P2 may be distributed within the first component area CA1. That is, the distance between the second subpixels P2 may be greater than the distance between the first subpixels P1. Meanwhile, an area of the first component area CA1 in which the second subpixels P2 are not arranged may be referred to as a transmission area TA having a high light transmittance.

Second pixel circuits PC2 implementing emission of the second subpixels P2 may be in the peripheral area DPA. Because the second pixel circuits PC2 are not arranged in the first component area CA1, a size of the transmission area TA of the first component area CA1 may be increased. In addition, wirings for applying constant voltages and signals to the second pixel circuit PC2 are not in the first component area CA1, and thus, the second subpixels P2 may be freely arranged without considering the arrangement of the wirings.

The second pixel circuits PC2 may be connected to the second subpixels P2, respectively, by the connection wirings TWL. The connection wiring TWL may include a transparent conductive material. For example, the connection wiring TWL may include a transparent conducting oxide (TCO).

The connection wiring TWL may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO).

That the connection wiring TWL is connected to the second subpixel P2 may mean that the connection wiring TWL is electrically connected to a pixel electrode of a display element that implements the second subpixel P2.

According to some example embodiments, subpixels may not be in the second component area CA2, unlike in the first component area CA1. The second component area CA2 may include a transmission area TA. For example, the transmission area TA may be understood as an opening area. The transmission area TA of the second component area CA2 may be formed by removing the substrate 100 and at least a portion of components on the substrate 100. According to some example embodiments, the second subpixels P2 may be in the second component area CA2 as in the first component area CA1. When the second subpixels P2 are in the second component area CA2, the transmission area TA may be reduced in size.

Third subpixels P3 may be between the first component area CA1 and the second component area CA2. Each of the third subpixels P3 may emit red, green, blue, or white light.

According to some example embodiments, third pixel circuits PC3 implementing emission of the third subpixels P3 may be in the peripheral area DPA. Because the third pixel circuits PC3 driving the third subpixels P3 are in the peripheral area DPA, an area between the first component area CA1 and the second component area CA2 is reduced, and thus, the visibility of the display apparatus may be improved.

The third pixel circuits PC3 may be connected to the third subpixels P3, respectively, by the connection wirings TWL. According to some example embodiments, the connection wiring TWL may include a transparent conductive material. According to some example embodiments, the connection wiring TWL may include at least one of aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), or copper (Cu).

That the connection wiring TWL is connected to the third subpixel P3 may mean that the connection wiring TWL is electrically connected to a pixel electrode of a display element that implements the third subpixel P3.

According to some example embodiments, the third subpixel P3 is between the first component area CA1 and the second component area CA2, wherein a smaller number of third subpixels P3 may be arranged in a position adjacent to the first component area CA1 and the second component area CA2. That is, the number of third subpixels P3 may decrease from the center between the first component area CA1 and the second component area CA2 toward a boundary of the first component area CA1 or a boundary of the second component area CA2. Through this, a pixel density of the main display area MDA between the first component area CA1 and the second component area CA2 and a pixel density of an area adjacent to the first component area CA1 or the second component area CA2 may be differentiated, and thus, the visibility of the display apparatus may be improved.

A scan line SL may include a main scan line SLm connected to the first pixel circuits PC1 and an auxiliary scan line SLa connected to the second pixel circuits PC2. The main scan line SLm extends in the first direction (the x-direction) and may be connected to the first pixel circuits PC1 in the same row. The main scan line SLm may not be in the first and second component areas CA1 and CA2. In other words, the main scan line SLm may be short-circuited with the first and second component areas CA1 and CA2 therebetween. In this case, the main scan line SLm on the left side of the first component area CA1 receives a signal from the first scan driving circuit SDRV1 (see FIG. 3A), and the main scan line SLm on the right side of the second component area CA2 may receive a signal from the second scan driving circuit SDRV2 (see FIG. 3A).

The auxiliary scan line SLa may be connected to the second pixel circuit PC2 driving the second subpixels P2. The main scan line SLm and the auxiliary scan line SLa are connected to each other by a scan connection wiring SWL, and thus, the same signal may be applied to pixel circuits driving the main subpixel Pm and the auxiliary subpixel Pa, which are arranged on the same row.

The scan connection wiring SWL is on a different layer from a layer on which the main scan line SLm and the auxiliary scan line SLa are arranged, and may be connected to each of the main scan line SLm and the auxiliary scan line SLa via contact holes. The scan connection wiring SWL may be in the peripheral area DPA.

According to some example embodiments, because the third pixel circuit PC3 driving the third subpixel P3 is in the peripheral area DPA, the auxiliary scan line SLa may be connected to the third pixel circuit PC3 driving the third subpixel P3. According to some example embodiments, the main scan line SLm instead of the auxiliary scan line SLa may be connected to the third pixel circuit PC3.

A data line DL may include a main data line DLm connected to the first pixel circuits PC1 and an auxiliary data line DLa connected to the second pixel circuits PC2. The main data line DLm extends in the second direction (the y-direction) and may be connected to the first pixel circuits PC1 in the same column. The auxiliary data line DLa extends in the second direction (the y-direction) and may be connected to the second pixel circuits PC2 in the same column.

The main data line DLm and the auxiliary data line DLa may be spaced apart from each other with the first component area CA1 therebetween. The main data line DLm and the auxiliary data line DLa are connected to each other by a data connection line DWL, and the same signal may be applied to pixel circuits driving the first subpixel P1 and the second subpixel P2, which are arranged in the same column.

The data connection line DWL may bypass the first component area CA1. The data connection line DWL may overlap the first pixel circuits PC1 arranged in the main display area MDA. As the data connection line DWL is in the main display area MDA, it is not necessary to secure a separate space in which the data connection line DWL is arranged, and thus, an area of a dead space may be minimized (or significantly reduced).

The data connection line DWL is on a different layer from a layer on which the main data line DLm and the auxiliary data line DLa are arranged, and may be connected to each of the main data line DLm and the auxiliary data line DLa via contact holes.

In FIG. 4, the connection wiring TWL is integrally provided from the peripheral area DPA to the second subpixels P2 of the first component area CA1. However, embodiments are not limited thereto. As described with reference to FIG. 3B, the connection wiring TWL may be connected to the second pixel circuits PC2 through an additional connection wiring.

Figure 5:
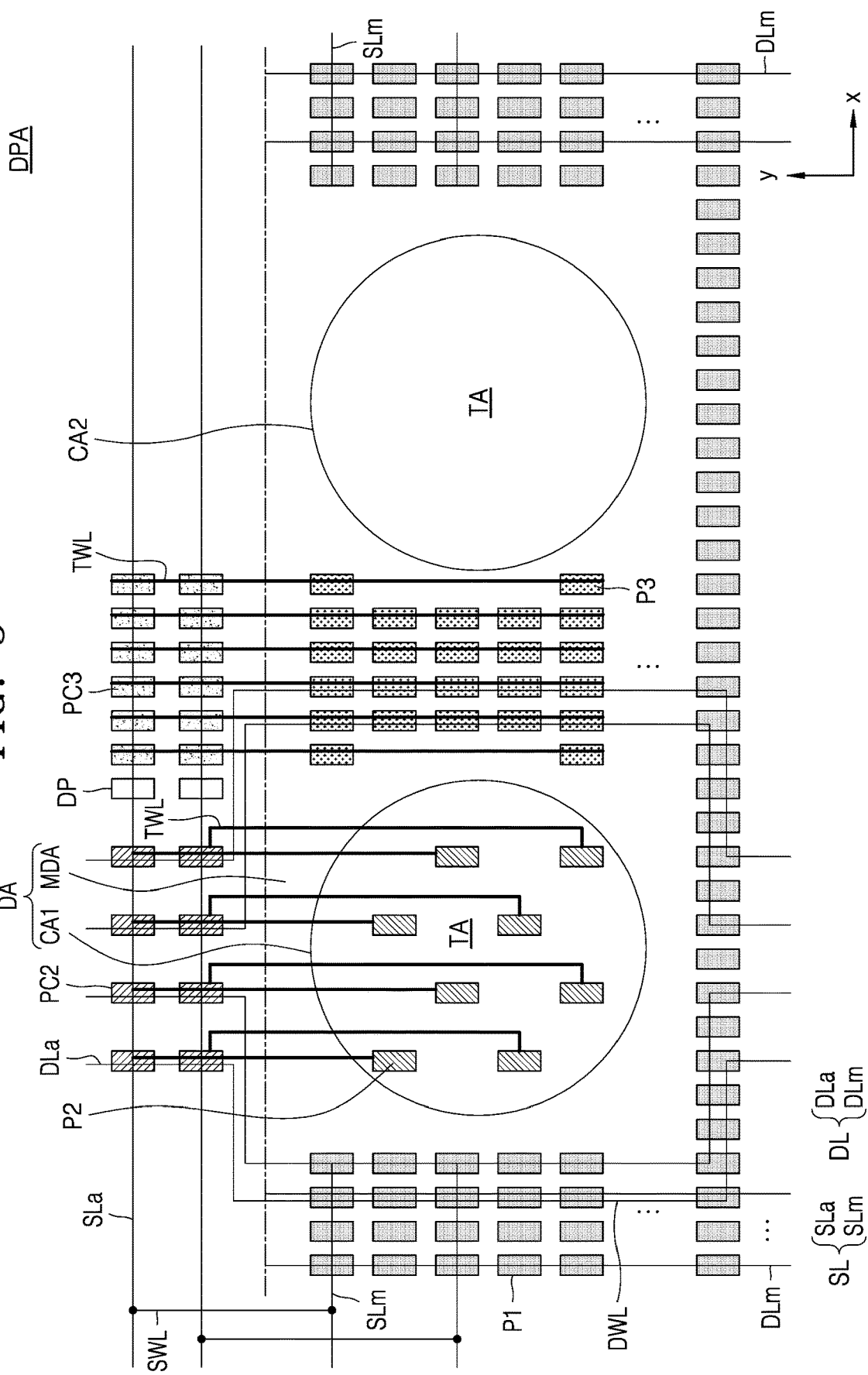
FIG. 5 is a schematic plan layout diagram illustrating a partial area of a display panel according to some example embodiments.

FIG. 5 is a schematic plan layout diagram illustrating a partial area of a display panel according to some example embodiments. The embodiments described with respect to FIG. 5 are different from the embodiments described with respect to FIG. 4 in that a dummy subpixel DP is further arranged in the peripheral area DPA. In FIG. 5, the same reference numerals as those in FIG. 4 refer to the same members, and some redundant description thereof may be omitted.

Referring to FIG. 5, the dummy subpixel DP may be further arranged in the peripheral area DPA. The dummy subpixel DP may be connected to the auxiliary scan line SLa. In this case, the dummy subpixel DP may be a subpixel to which actual signals are applied but which does not emit light. The detailed structure of the dummy subpixel DP will be described later below.

No pixel circuit is in the first and second component areas CA1 and CA2. Thus, signal lines that are not in the same row or column as the first and second component areas CA1 and CA2 pass through a large number of pixel circuits, but signal lines arranged in the same row or column as the first and second component areas CA1 and CA2 may pass through fewer pixel circuits than the signal lines not arranged in the same row or column as the first and second component areas CA1 and CA2. Thus, a signal delay occurs, and thus, a difference in luminance may occur between the subpixels not arranged in the same row or column as the first and second component areas CA1 and CA2 and the subpixels arranged in the same row or column as the first and second component areas CA1 and CA2.

According to some example embodiments, the dummy subpixel DP may be in a position adjacent to the second pixel circuit PC2 driving the second subpixel P2 arranged in the first component area CA1, thus preventing a signal delay from occurring. Thus, the luminance difference between the subpixels not arranged in the same row or column as the first and second component areas CA1 and CA2 and the subpixels arranged in the same row or column as the first and second component areas CA1 and CA2 may be prevented or minimized (or significantly reduced).

Figure 6:
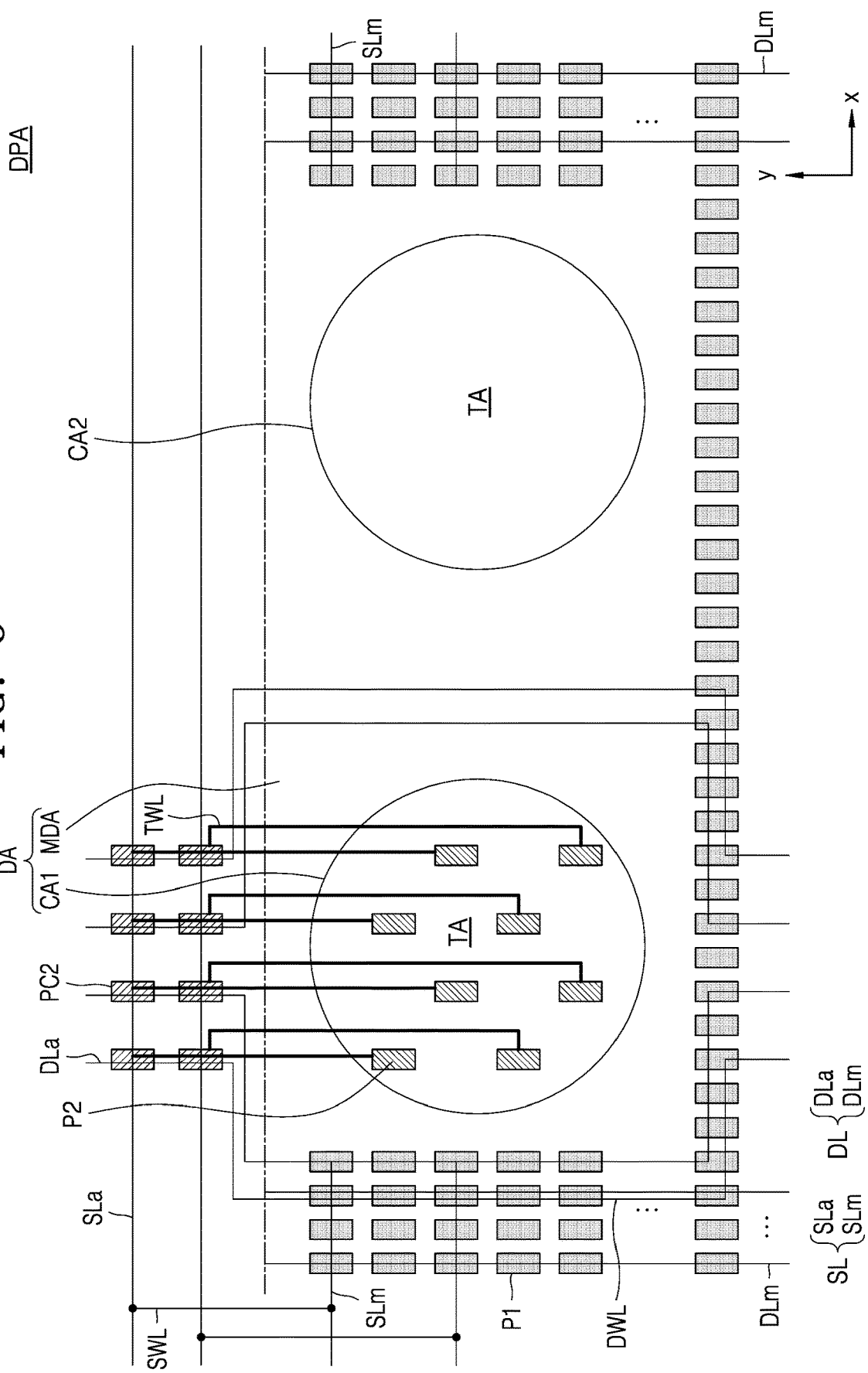
FIG. 6 is a schematic plan layout diagram illustrating a partial area of a display panel according to some example embodiments.

FIG. 6 is a schematic plan layout diagram illustrating a partial area of a display panel according to some example embodiments. The embodiments described with respect to FIG. 6 are different from the embodiments described with respect to FIG. 4 in that the subpixels are not arranged between the first component area CA1 and the second component area CA2. In FIG. 6, the same reference numerals as those in FIG. 4 refer to the same members, and some redundant description thereof may be omitted.

Referring to FIG. 6, a subpixel may not be arranged between the first component area CA1 and the second component area CA2. Because the subpixels are not arranged between the first component area CA1 and the second component area CA2, the first component area CA1 and the second component area CA2 may be provided closer together.

Figure 7:
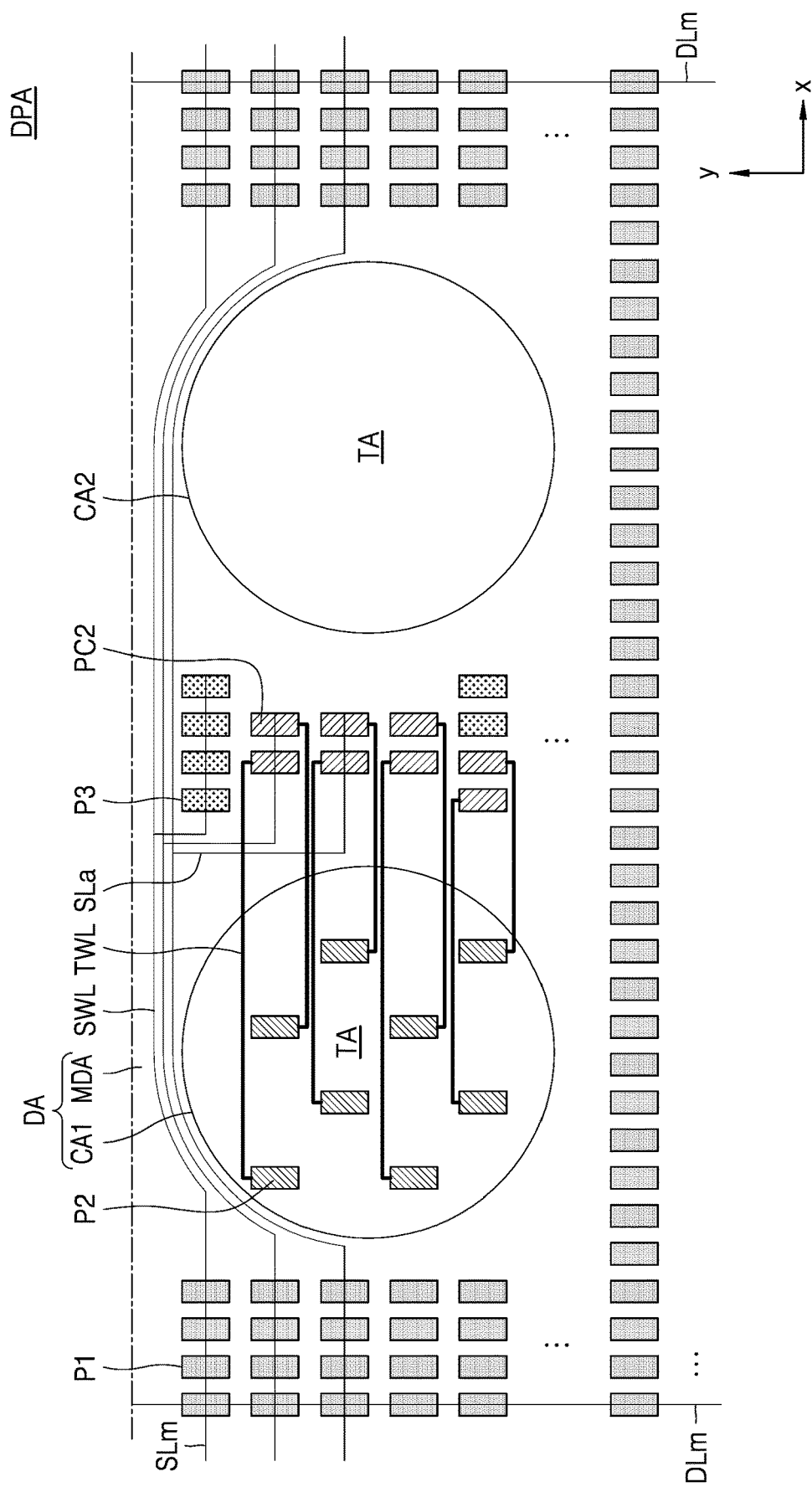
FIG. 7 is a schematic plan layout diagram illustrating a partial area of a display panel according to some example embodiments.

FIG. 7 is a schematic plan layout diagram illustrating a partial area of a display panel according to some example embodiments. The embodiments described with respect to FIG. 7 are different from the embodiments described with respect to FIG. 4 in that the second pixel circuit PC2 driving the second subpixel P2 is between the first component area CA1 and a second component area CA2. In FIG. 7, the same reference numerals as those in FIG. 4 refer to the same members, and some redundant description thereof may be omitted.

Referring to FIG. 7, the second pixel circuits PC2 driving the second subpixels P2 arranged in the first component area CA1 may be between the first component area CA1 and the second component area CA2. The second pixel circuit PC2 and a display element implementing the second subpixel P2 may be connected to each other by the connection wiring TWL, which extends in the first direction (the x-direction) and/or the second direction (the y-direction). Because the second pixel circuits PC2 are not arranged in the first component area CA1, the first component area CA1 may secure a larger transmission area TA.

According to some example embodiments, some of the scan signals output from the first scan driving circuit SDRV1 (see FIG. 3A) may be applied to the first pixel circuit PC1 through the main scan line SLm. The main scan line SLm extending in the first direction (the x-direction) may be connected to the scan connection wiring SWL that bypasses one side of the first component area CA1. The scan connection wiring SWL may bypass one side of the first component area CA1 along the edge of the one side of the first component area CA1. The scan connection wiring SWL is connected to the auxiliary scan line SLa between the first component area CA1 and the second component area CA2 so that a scan signal may be transmitted to the second pixel circuit PC2. Through this, scan signals of the same row may be applied to the first and second pixel circuits PC1 and PC2 arranged in the same row.

The third subpixel P3 may be between the first component area CA1 and the second component area CA2. The third pixel circuit PC3 driving the third subpixel P3 is also between the first component area CA1 and the second component area CA2, and may overlap the third subpixel P3.

Figure 8:
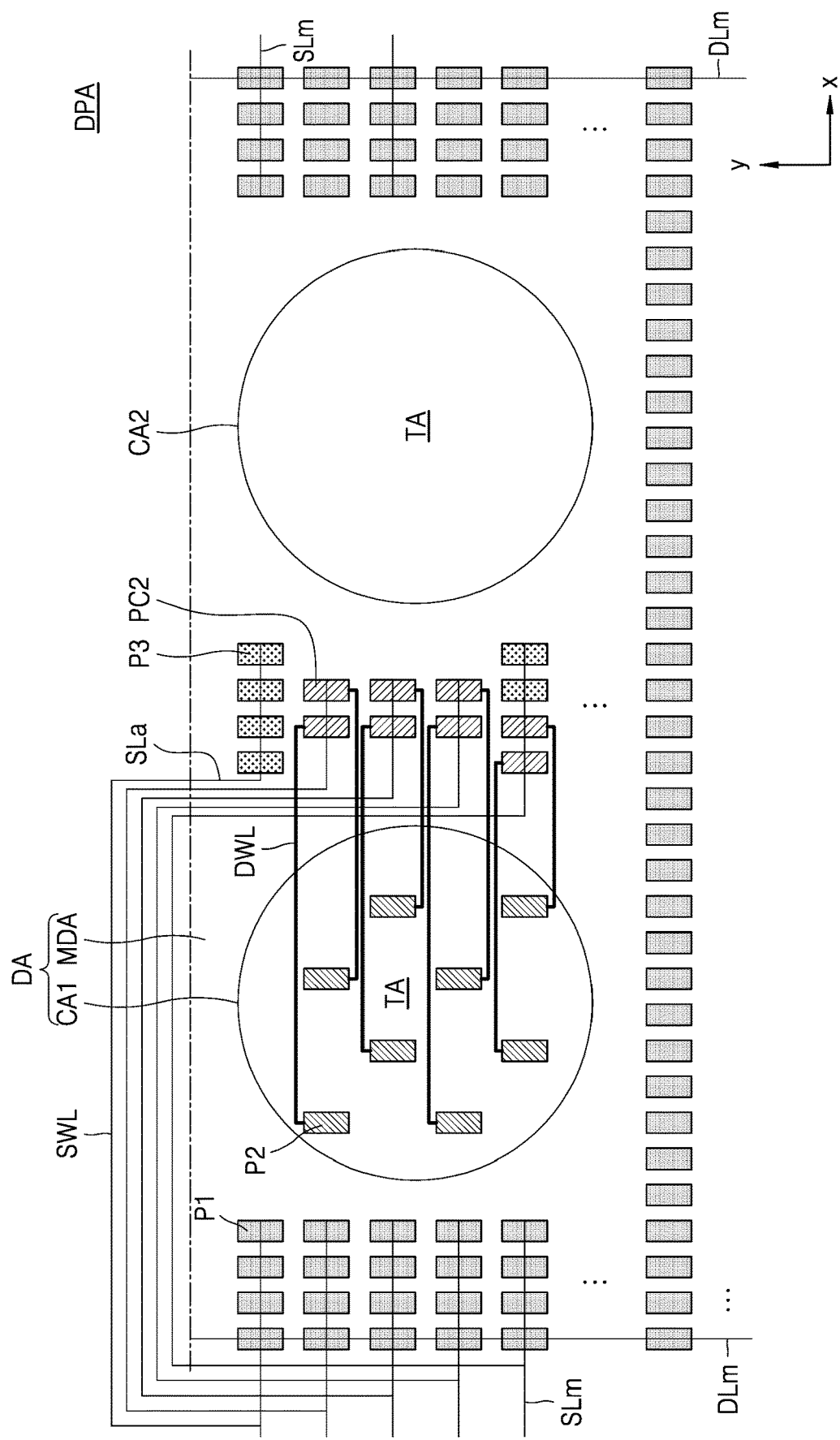
FIG. 8 is a schematic plan layout diagram illustrating a partial area of a display panel according to some example embodiments.

FIG. 8 is a schematic plan layout diagram illustrating a partial area of a display panel according to some example embodiments. The embodiments described with respect to FIG. 8 are different from the embodiments described with respect to FIG. 4 in that the second pixel circuit PC2 driving the second subpixel P2 is between the first component area CA1 and the second component area CA2. The embodiments described with respect to FIG. 8 are different from the embodiments described with respect to FIG. 7 in that the scan connection wiring SWL is in the peripheral area DPA. In FIG. 8, the same reference numerals as those in FIGS. 4 and 7 refer to the same members, and some redundant description thereof may be omitted.

Referring to FIG. 8, some of the scan signals output from the first scan driving circuit SDRV1 (see FIG. 3A) may be applied to the first pixel circuit PC1 through the main scan line SLm. The main scan line SLm extending in the first direction (the x-direction) may be connected to the scan connection wiring SWL arranged in the peripheral area DPA. The scan connection wiring SWL is arranged in the peripheral area DPA and may connect the main scan line SLm to the auxiliary scan line SLa. The scan connection wiring SWL is connected to the auxiliary scan line SLa between the first component area CA1 and the second component area CA2 so that a scan signal may be transmitted to the second pixel circuit PC2. Through this, scan signals of the same row may be applied to the first and second pixel circuits PC1 and PC2 arranged in the same row.

Figure 9:
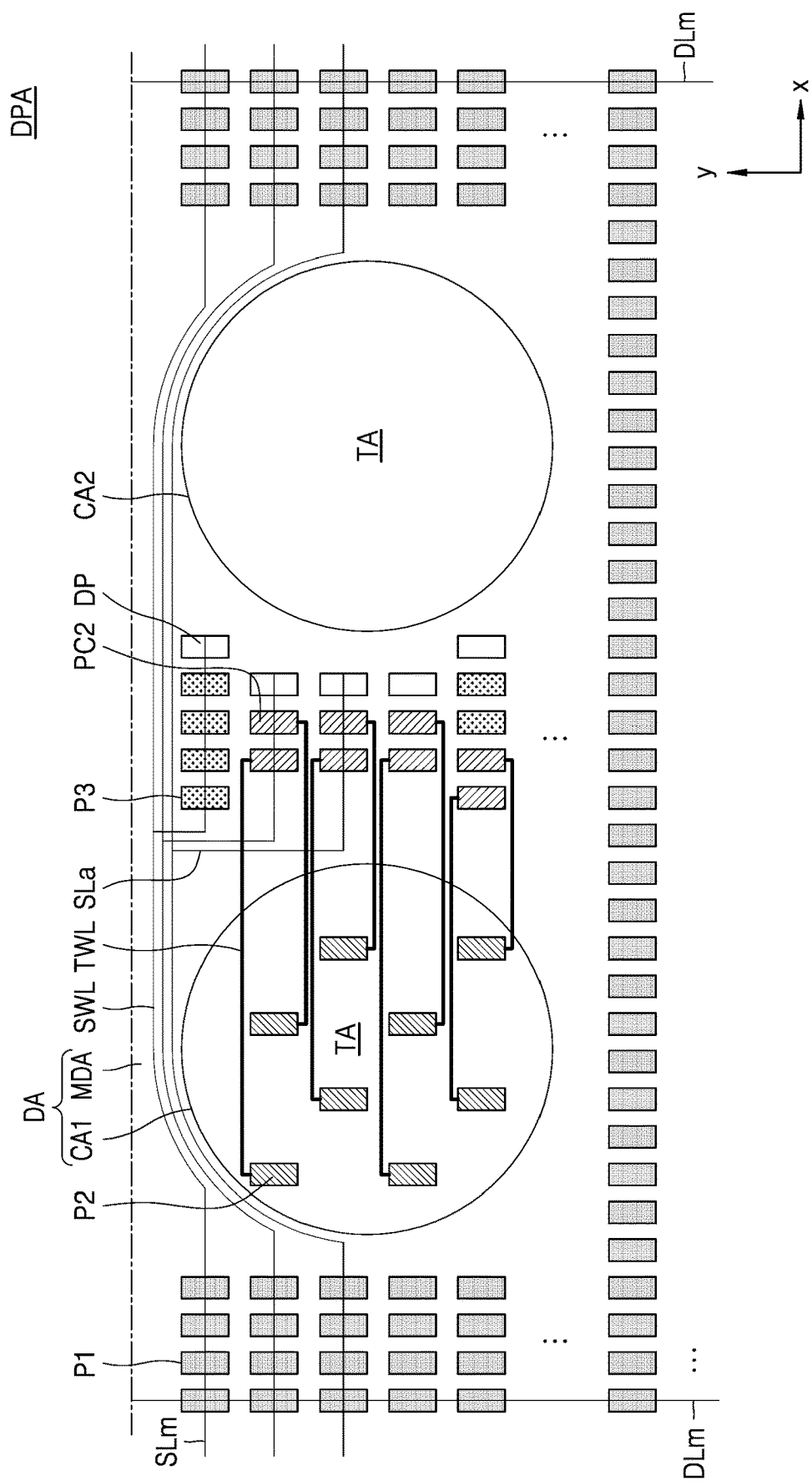
FIG. 9 is a schematic plan layout diagram illustrating a partial area of a display panel according to some example embodiments.

FIG. 9 is a schematic plan layout diagram illustrating a partial area of a display panel according to some example embodiments. The embodiments described with respect to FIG. 9 are different from the embodiments described with respect to FIG. 7 in that the dummy subpixel DP is between the first component area CA1 and the second component area CA2. In FIG. 9, the same reference numerals as those in FIG. 7 refer to the same members, and some redundant description thereof may be omitted.

Referring to FIG. 9, the dummy subpixel DP may be further arranged between the first component area CA1 and the second component area CA2. As described above, the dummy subpixel DP may be a subpixel to which actual signals are applied but which does not emit light.

By placing the dummy subpixel DP between the first component area CA1 and the second component area CA2, a signal delay is prevented from occurring, and thus, the luminance difference between the subpixels not arranged in the same row or column as the first and second component areas CA1 and CA2 and the subpixels arranged in the same row or column as the first and second component areas CA1 and CA2 may be prevented or minimized or reduced.

Figure 10:
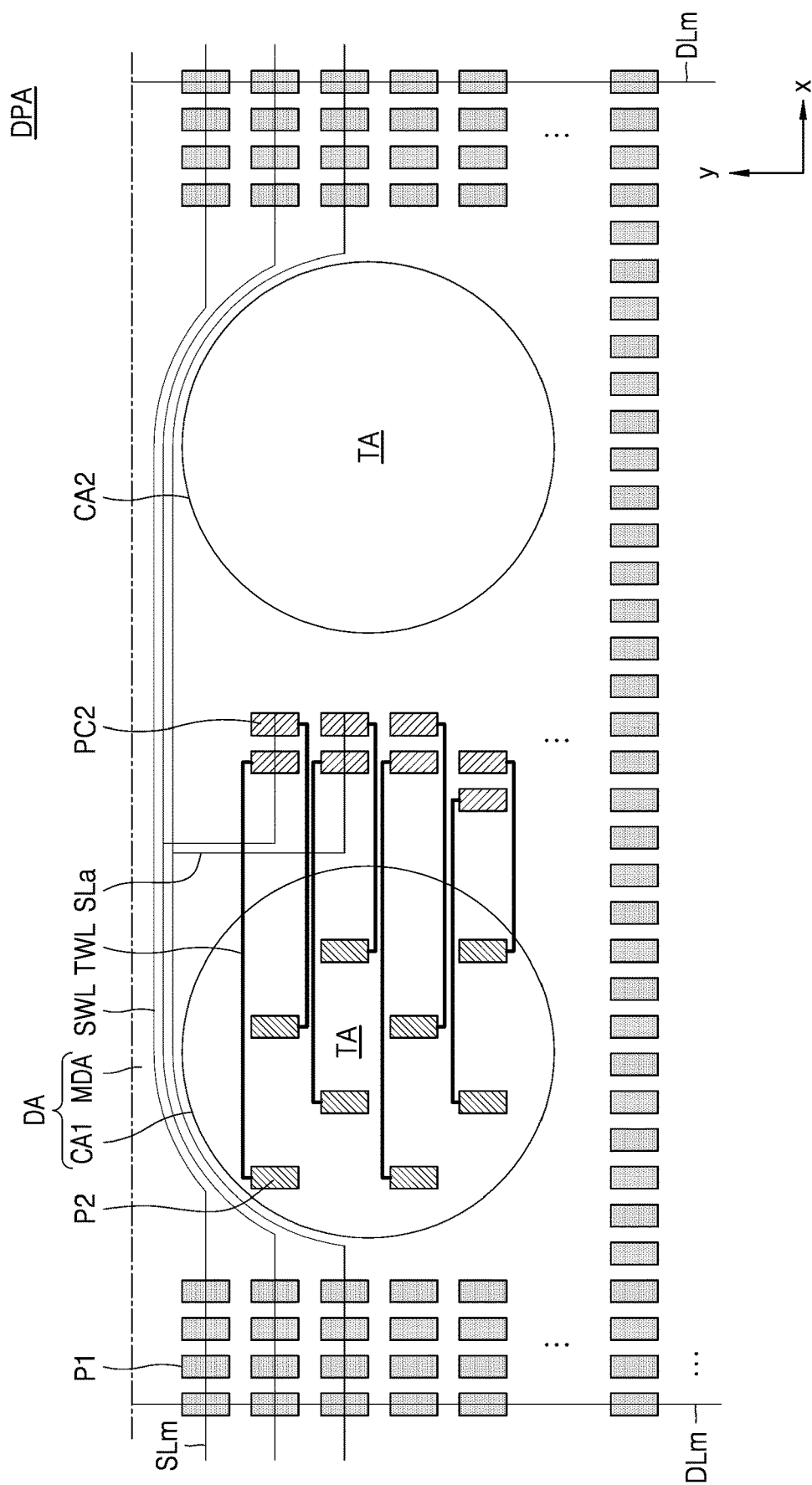
FIG. 10 is a schematic plan layout diagram illustrating a partial area of a display panel according to some example embodiments.

FIG. 10 is a schematic plan layout diagram illustrating a partial area of a display panel according to some example embodiments. The embodiments described with respect to FIG. 10 are different from the embodiments described with respect to FIG. 7 in that no subpixel is arranged between the first component area CA1 and the second component area CA2. In FIG. 10, the same reference numerals as those in FIG. 7 refer to the same members, and some redundant description thereof may be omitted.

Referring to FIG. 10, a subpixel may not be arranged between the first component area CA1 and the second component area CA2. Because the subpixels are not arranged between the first component area CA1 and the second component area CA2, the first component area CA1 and the second component area CA2 may be provided closer together.

Figure 11:
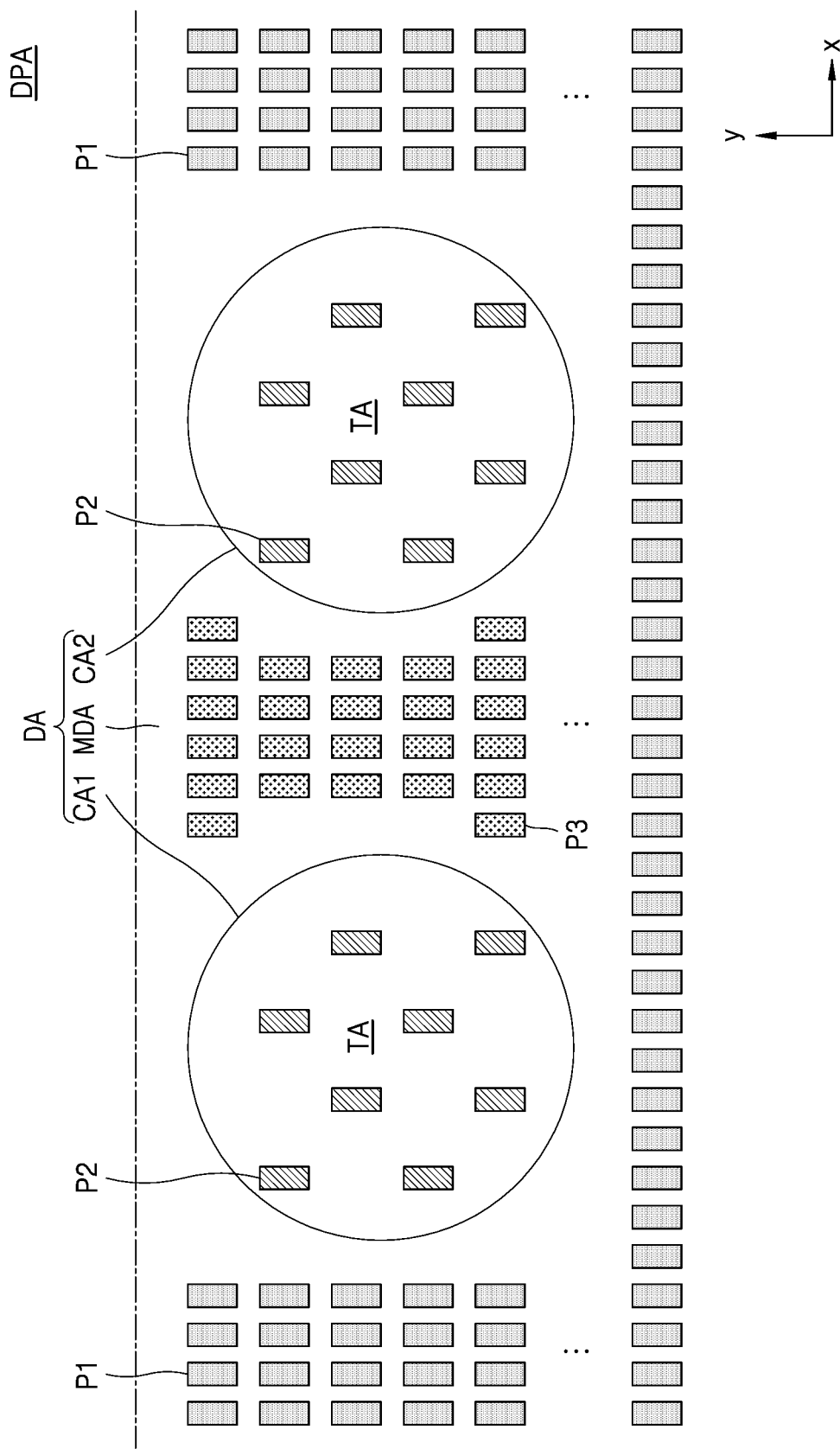
FIG. 11 is a schematic plan layout diagram illustrating a partial area of a display panel according to some example embodiments.

FIG. 11 is a schematic plan layout diagram illustrating a partial area of a display panel according to some example embodiments.

Referring to FIG. 11, a display area DA may include a main display area MDA, a first component area CA1, and a second component area CA2. First subpixels P1 may be in the main display area MDA, and second subpixels P2 may be in the first component area CA1 and the second component area CA2. Third subpixels P3 may be in the main display area MDA between the first component area CA1 and the second component area CA2.

Because the subpixels in the first component area CA1 and the second component area CA2 is less dense than the subpixels in the main display area MDA, the light transmittance of the first component area CA1 and the second component area CA2 may be greater than the light transmittance of the main display area MDA.

Figure 12:
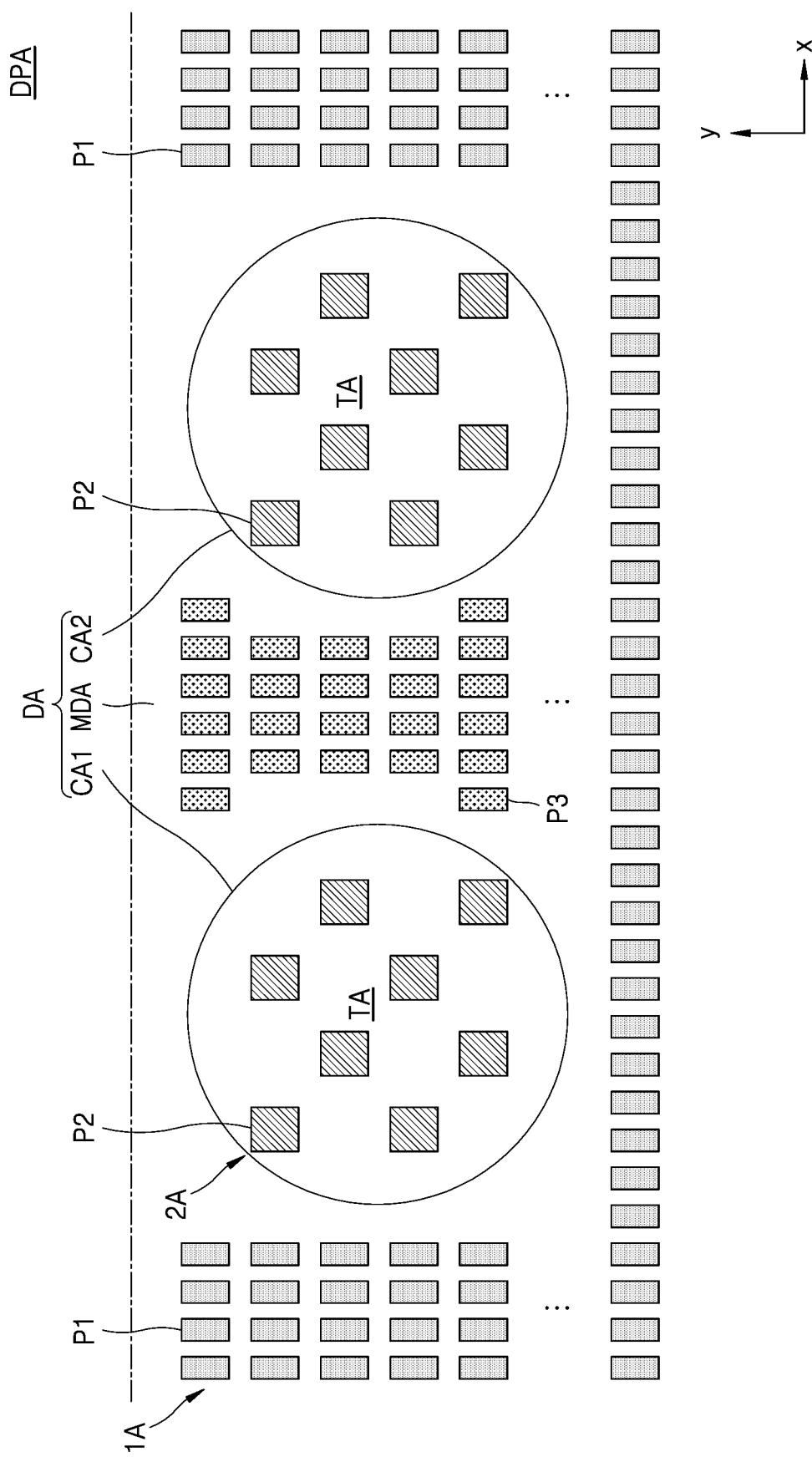
FIG. 12 is a schematic plan layout diagram illustrating a partial area of a display panel according to some example embodiments.

FIG. 12 is a schematic plan layout diagram illustrating a partial area of a display panel according to some example embodiments. The embodiments described with respect to FIG. 12 differs from the embodiments described with respect to FIG. 11 in that the subpixels in the first component area CA1 and the second component area CA2 are larger in size than the subpixels in the main display area MDA. In FIG. 12, the same reference numerals as those in FIG. 11 refer to the same members, and some redundant description thereof may be omitted.

Referring to FIG. 12, the display area DA may include the main display area MDA, the first component area CA1, and the second component area CA2. The first subpixels P1 may be in the main display area MDA, and the second subpixels P2 may be in the first component area CA1 and the second component area CA2. The third subpixels P3 may be in the main display area MDA between the first component area CA1 and the second component area CA2.

According to some example embodiments, the second subpixel P2 in the first component area CA1 and the second component area CA2 may be larger in size than the first subpixel P1 in the main display area MDA. In more detail, the first subpixel P1 in the main display area MDA may have a first area 1A, and the second subpixel P2 in the first component area CA1 and the second component area CA2 may have a second area 2A greater than the first area 1A.

Because the second subpixel P2 in the first component area CA1 and the second component area CA2 is larger in size than the first subpixel P1 in the main display area MDA, the visibility of the first component area CA1 and the second component area CA2 may be improved.

According to some example embodiments, the second subpixels P2 in the second component area CA2 may be omitted.

Figure 13:
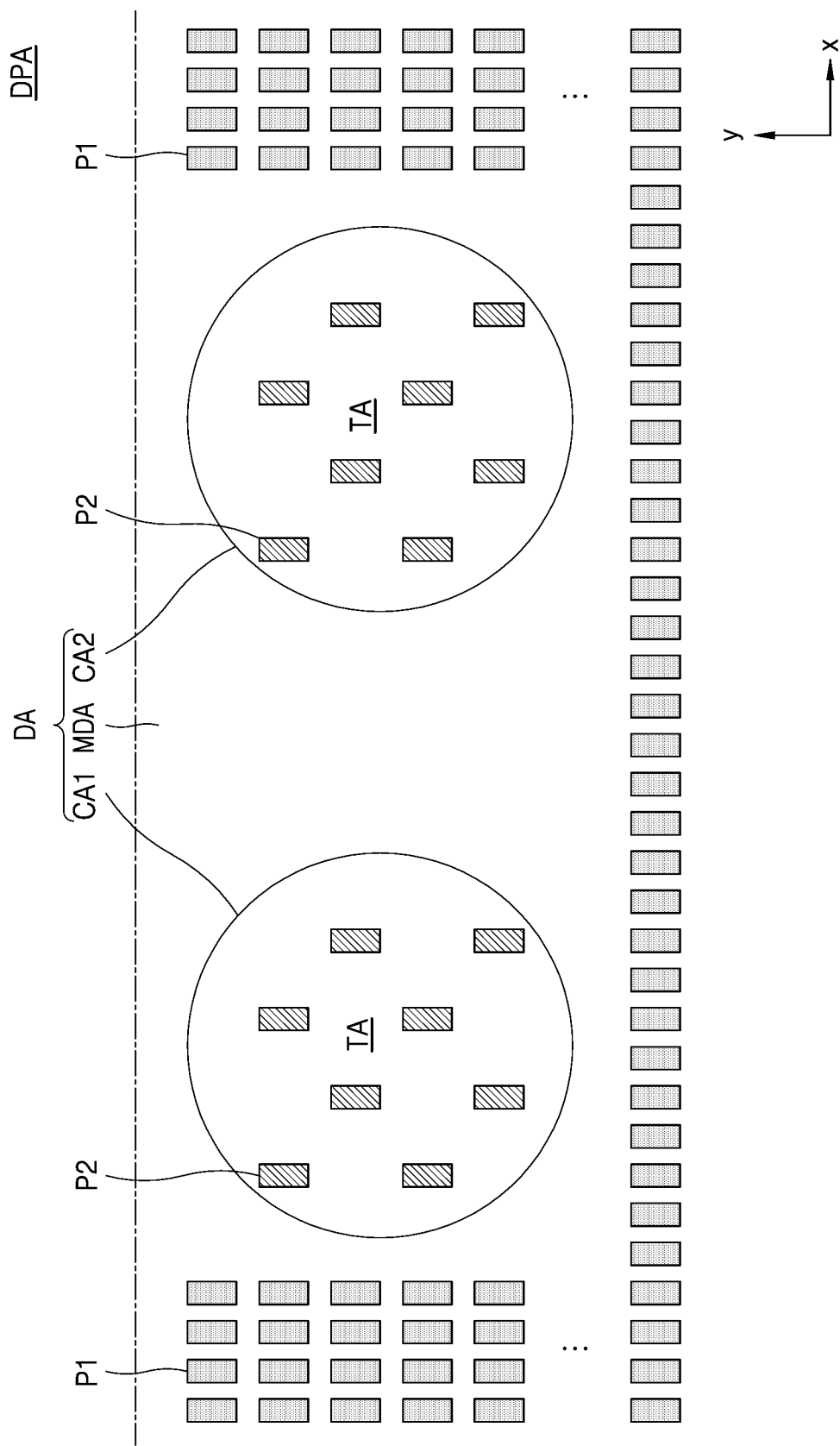
FIG. 13 is a schematic plan layout diagram illustrating a partial area of a display panel according to some example embodiments.

FIG. 13 is a schematic plan layout diagram illustrating a partial area of a display panel according to some example embodiments. The embodiments described with respect to FIG. 13 are different from the embodiments described with respect to FIG. 11 in that no subpixel is between the first component area CA1 and the second component area CA2. In FIG. 13, the same reference numerals as those in FIG. 11 refer to the same members, and some redundant description thereof may be omitted.

Referring to FIG. 13, a subpixel may not be arranged between the first component area CA1 and the second component area CA2. Because no subpixel is between the first component area CA1 and the second component area CA2, the first component area CA1 and the second component area CA2 may be closer together.

Figure 14:
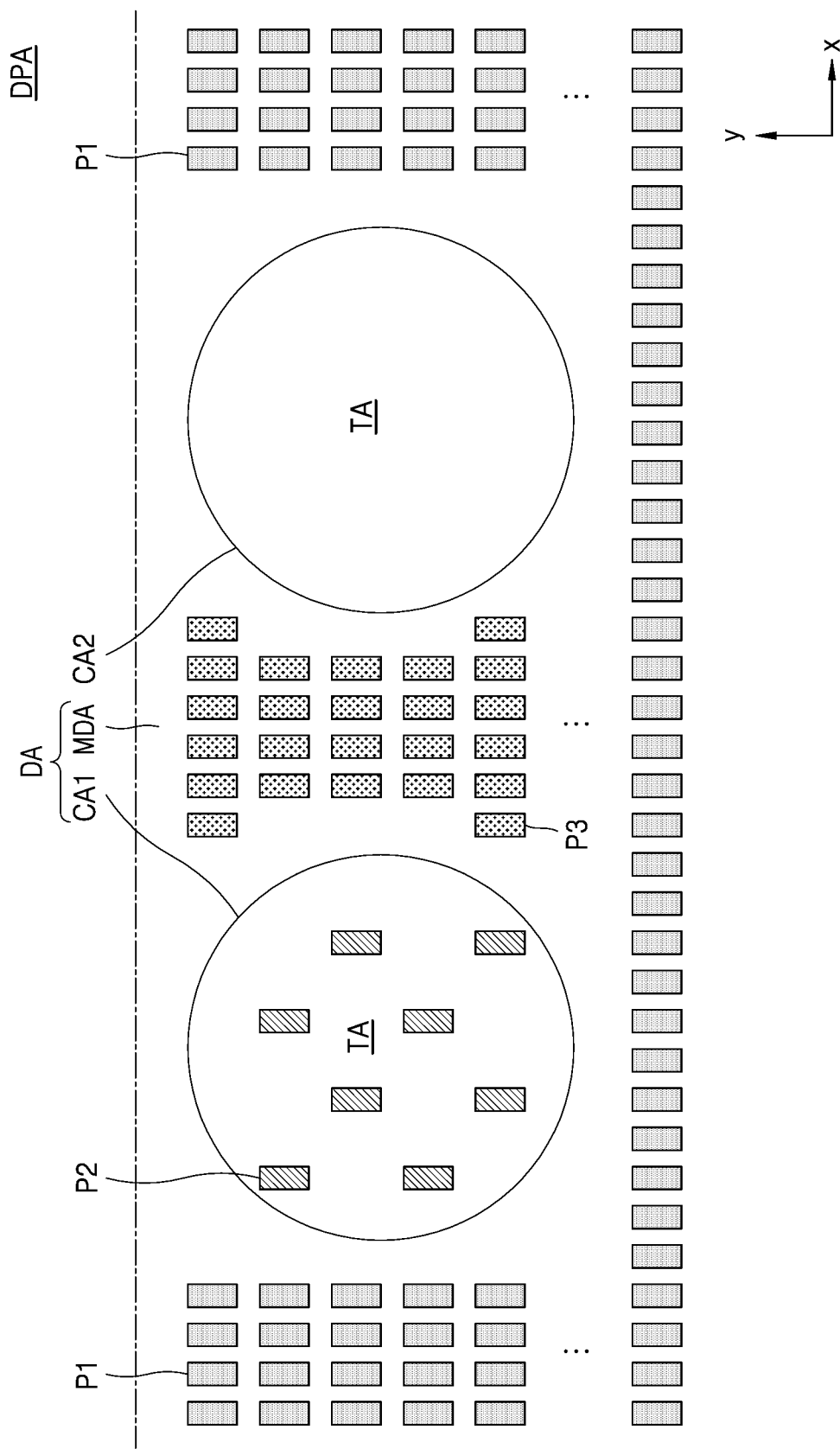
FIG. 14 is a schematic plan layout diagram illustrating a partial area of a display panel according to some example embodiments.

FIG. 14 is a schematic plan layout diagram illustrating a partial area of a display panel according to some example embodiments. The embodiments described with respect to FIG. 14 are different from the embodiments described with respect to FIG. 11 in that no subpixel is arranged in the second component area CA2. In FIG. 14, the same reference numerals as those in FIG. 11 refer to the same members, and some redundant description thereof may be omitted.

Referring to FIG. 14, the display area DA may include the main display area MDA and the first component area CA1. The first subpixels P1 may be in the main display area MDA, and the second subpixels P2 may be in the first component area CA1. The third subpixels P3 may be in the main display area MDA between the first component area CA1 and the second component area CA2.

Subpixels may not be in the second component area CA2. Because no subpixel is in the second component area CA2, the light transmittance of the second component area CA2 may be greater than that of the first component area CA1.

According to some example embodiments, a camera may be in the first component area CA1 to correspond to the first component area CA1, and a three-dimensional (3D) infrared (IR) sensor, a radar sensor, or the like that requires high resolution may be in the second component area CA2 having a greater light transmittance than the first component area CA1.

Figure 15:
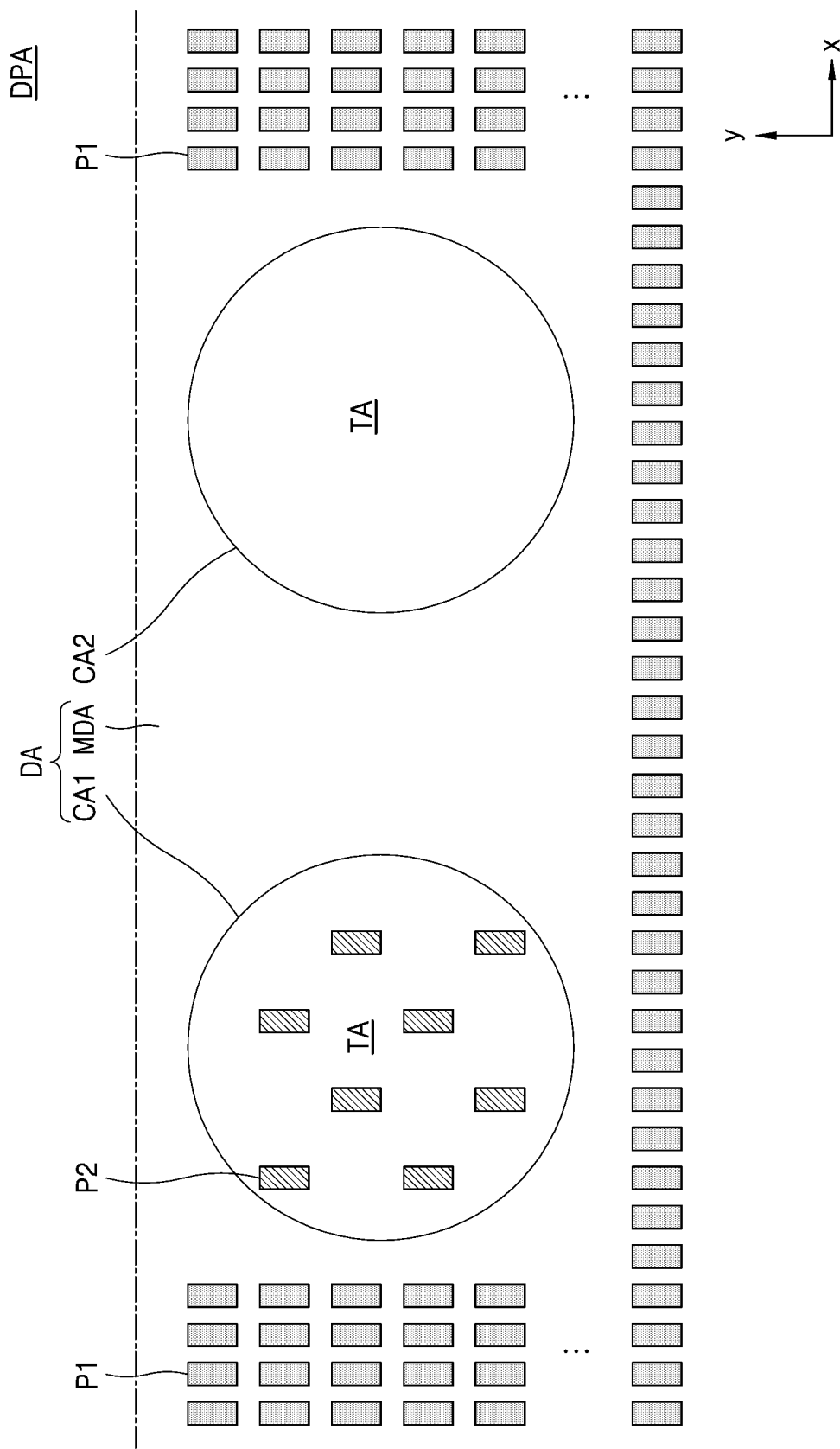
FIG. 15 is a schematic plan layout diagram illustrating a partial area of a display panel according to some example embodiments.

FIG. 15 is a schematic plan layout diagram illustrating a partial area of a display panel according to some example embodiments. The embodiments described with respect to FIG. 15 are different from the embodiments described with respect to FIG. 14 in that a subpixel is not arranged between the first component area CA1 and the second component area CA2. In FIG. 15, the same reference numerals as those in FIG. 14 refer to the same members, and some redundant description thereof may be omitted.

Referring to FIG. 15, a subpixel may not be arranged between the first component area CA1 and the second component area CA2. Because no subpixel is arranged between the first component area CA1 and the second component area CA2, the first component area CA1 and the second component area CA2 may be provided closer together.

Figure 16:
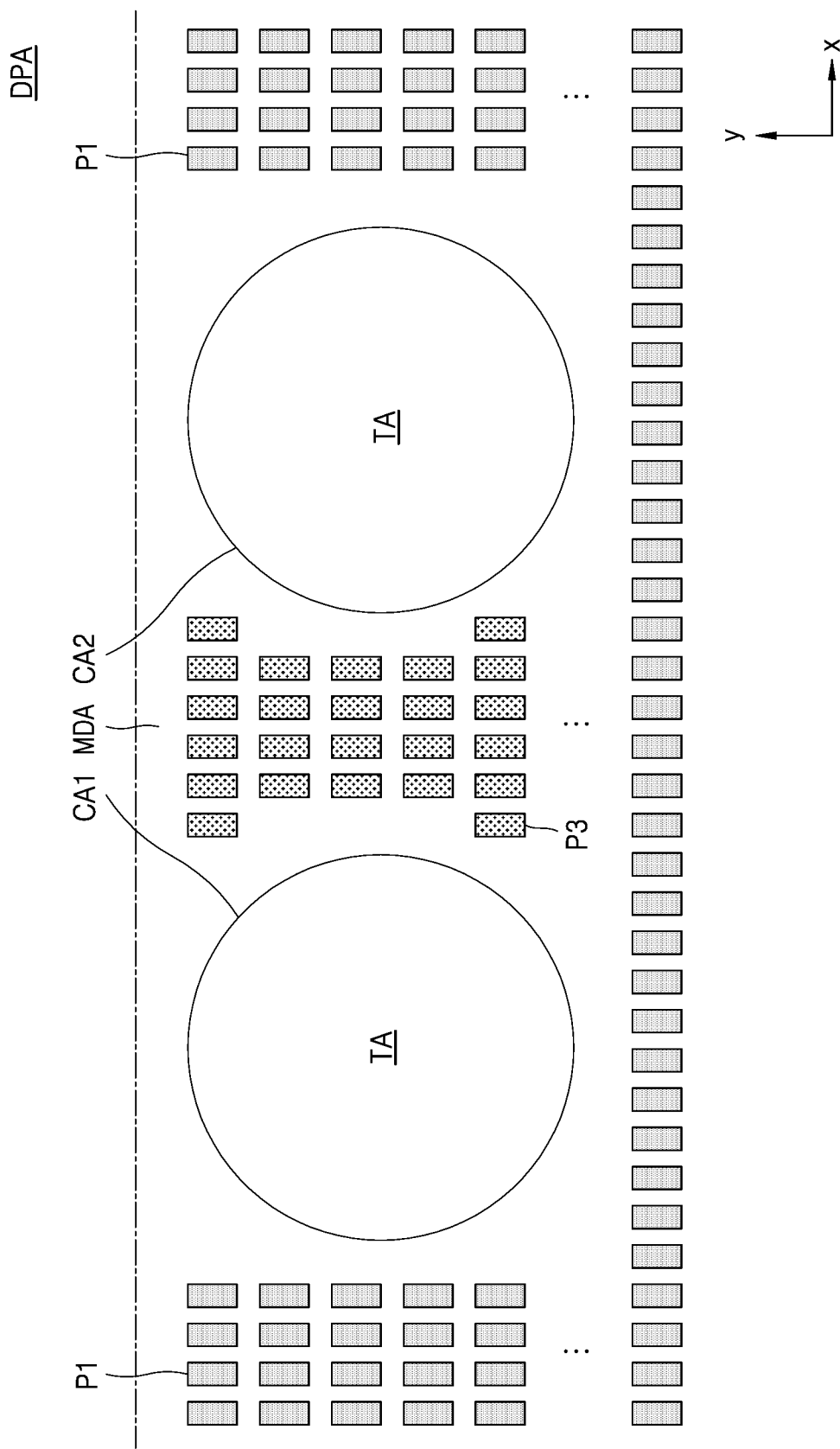
FIG. 16 is a schematic plan layout diagram illustrating a partial area of a display panel according to some example embodiments.

FIG. 16 is a schematic plan layout diagram illustrating a partial area of a display panel according to some example embodiments. The embodiments described with respect to FIG. 16 are different from the embodiments described with respect to FIG. 14 in that no subpixel is arranged in the first component area CA1. In FIG. 16, the same reference numerals as those in FIG. 14 refer to the same members, and some redundant description thereof may be omitted.

Referring to FIG. 16, the first subpixels P1 may be in the main display area MDA. The third subpixels P3 may be in the main display area MDA between the first component area CA1 and the second component area CA2.

Subpixels may not be arranged in the first component area CA1 and the second component area CA2. Because no subpixel is in the first component area CA1 and the second component area CA2, the light transmittance of the first component area CA1 and the second component area CA2 may be improved.

According to some example embodiments, sensors requiring high resolution, such as a 3D IR sensor and a radar sensor, may be arranged to correspond to the first component area CA1 and the second component area CA2 with improved light transmittance.

Figure 17:
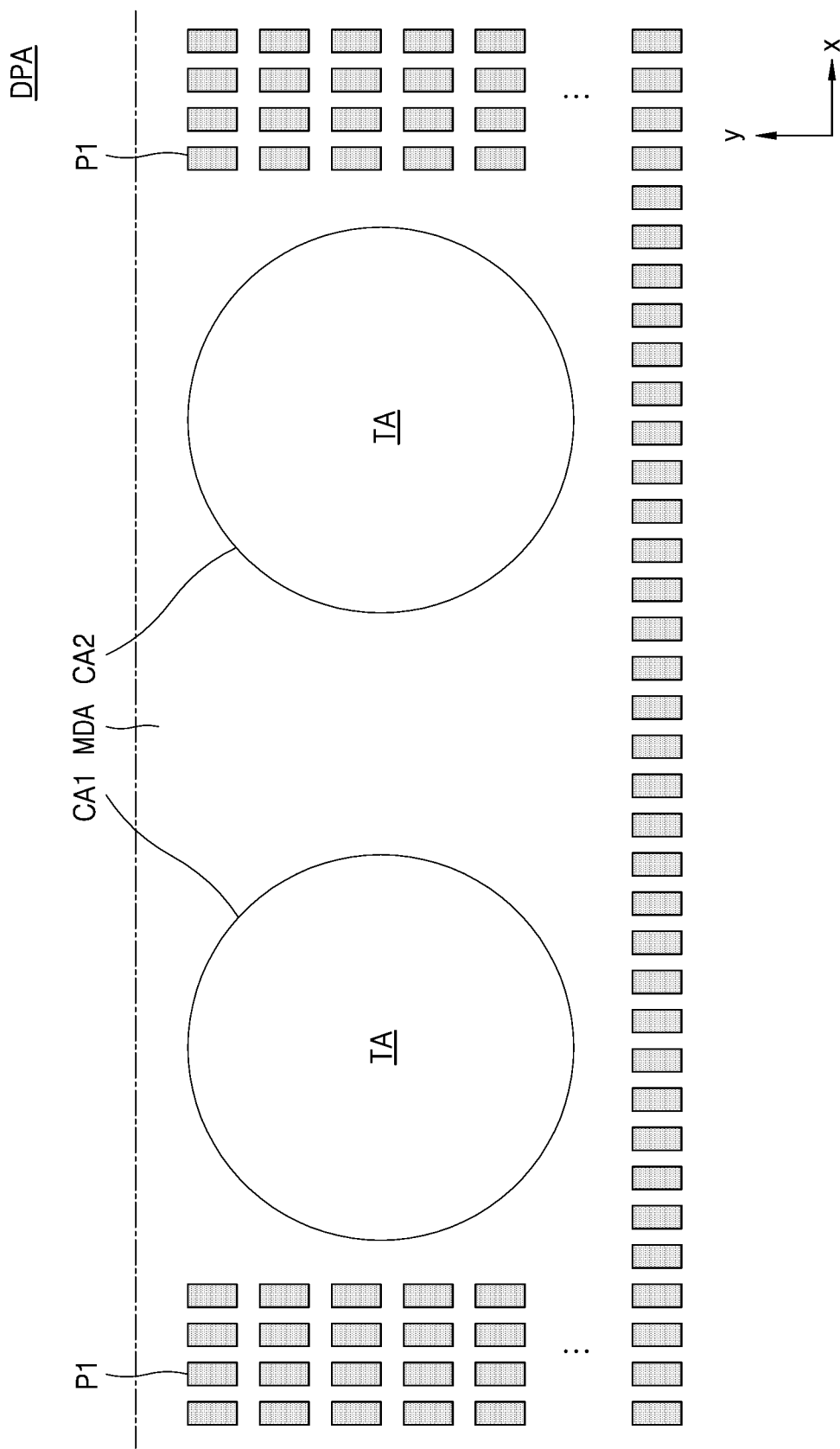
FIG. 17 is a schematic plan layout diagram illustrating a partial area of a display panel according to some example embodiments.

FIG. 17 is a schematic plan layout diagram illustrating a partial area of a display panel according to some example embodiments. The embodiments described with respect to FIG. 17 are different from the embodiments described with respect to FIG. 16 in that no subpixel is between the first component area CA1 and the second component area CA2. In FIG. 17, the same reference numerals as those in FIG. 16 refer to the same members, and some redundant description thereof may be omitted.

Referring to FIG. 17, a subpixel may not be arranged between the first component area CA1 and the second component area CA2. Because no subpixel is between the first component area CA1 and the second component area CA2, the first component area CA1 and the second component area CA2 may be provided closer together.

Figure 18:
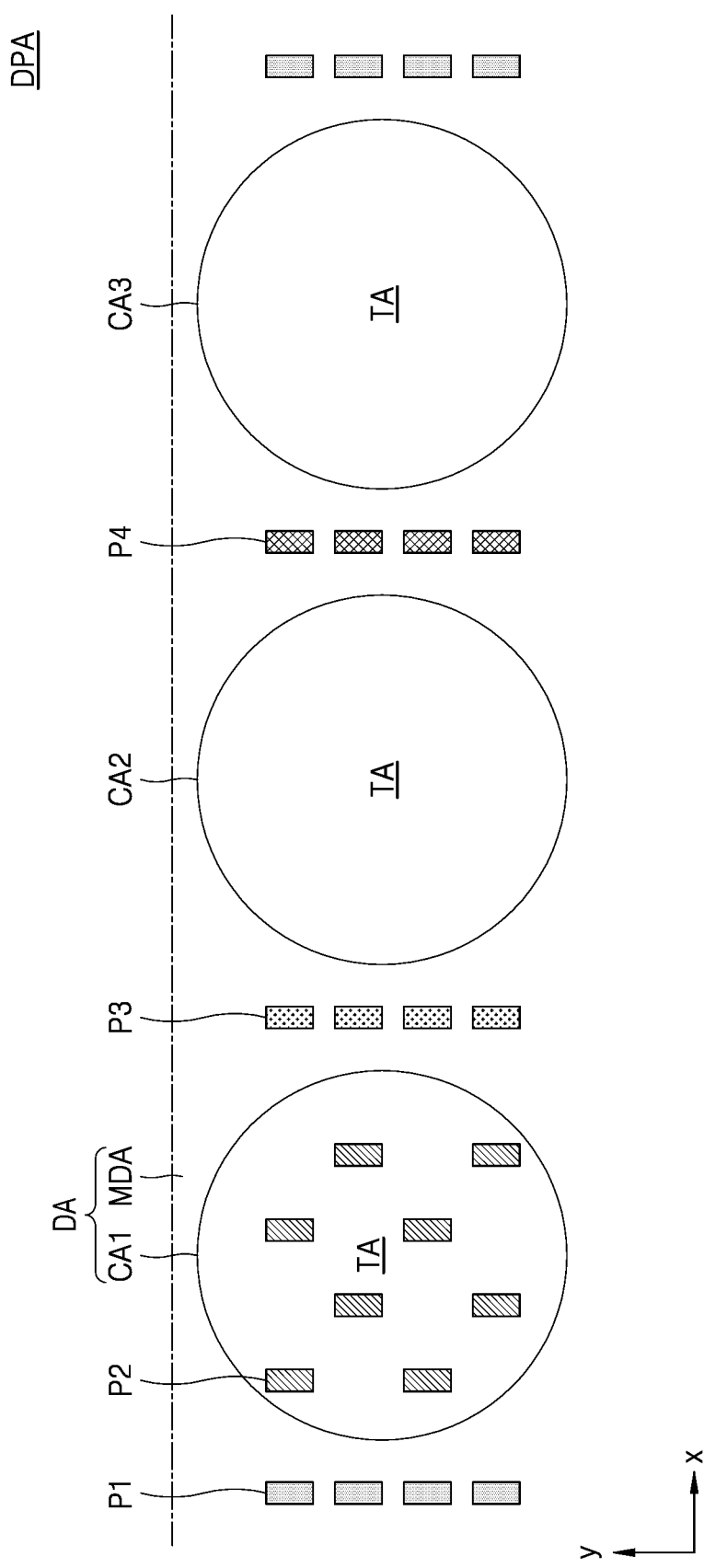
FIG. 18 is a schematic plan layout diagram illustrating a partial area of a display panel according to some example embodiments.

FIG. 18 is a schematic plan layout diagram illustrating a partial area of a display panel according to some example embodiments.

Referring to FIG. 18, the display panel may include the main display area MDA, the first component area CA1, the second component area CA2, and a third component area CA3. The first component area CA1, the second component area CA2, and the third component area CA3 may be spaced apart from one another in the first direction (the x-direction).

The display area DA may include the main display area MDA and the first component area CA1. That is, the first component area CA1 and the main display area MDA may display an image individually or together.

The first subpixels P1 may be in the main display area MDA, and the second subpixel P2 may be in the first component area CA1. The third subpixel P3 may be in the main display area MDA between the first component area CA1 and the second component area CA2, and a fourth subpixel P4 may be between the second component area CA2 and the third component area CA3.

According to some example embodiments, subpixels may not be arranged in the second component area CA2 and the third component area CA3. Because no subpixel is in the second component area CA2 and the third component area CA3, the light transmittance of the second component area CA2 and the third component area CA3 may be improved. Thus, sensors requiring high resolution may be arranged below the display panel to correspond to the second component area CA2 and the third component area CA3.

According to some example embodiments, subpixels may be in the second component area CA2 or the third component area CA3. By placing the subpixels in the second component area CA2 or the third component area CA3, the visibility of the display panel may be improved.

Figure 19:
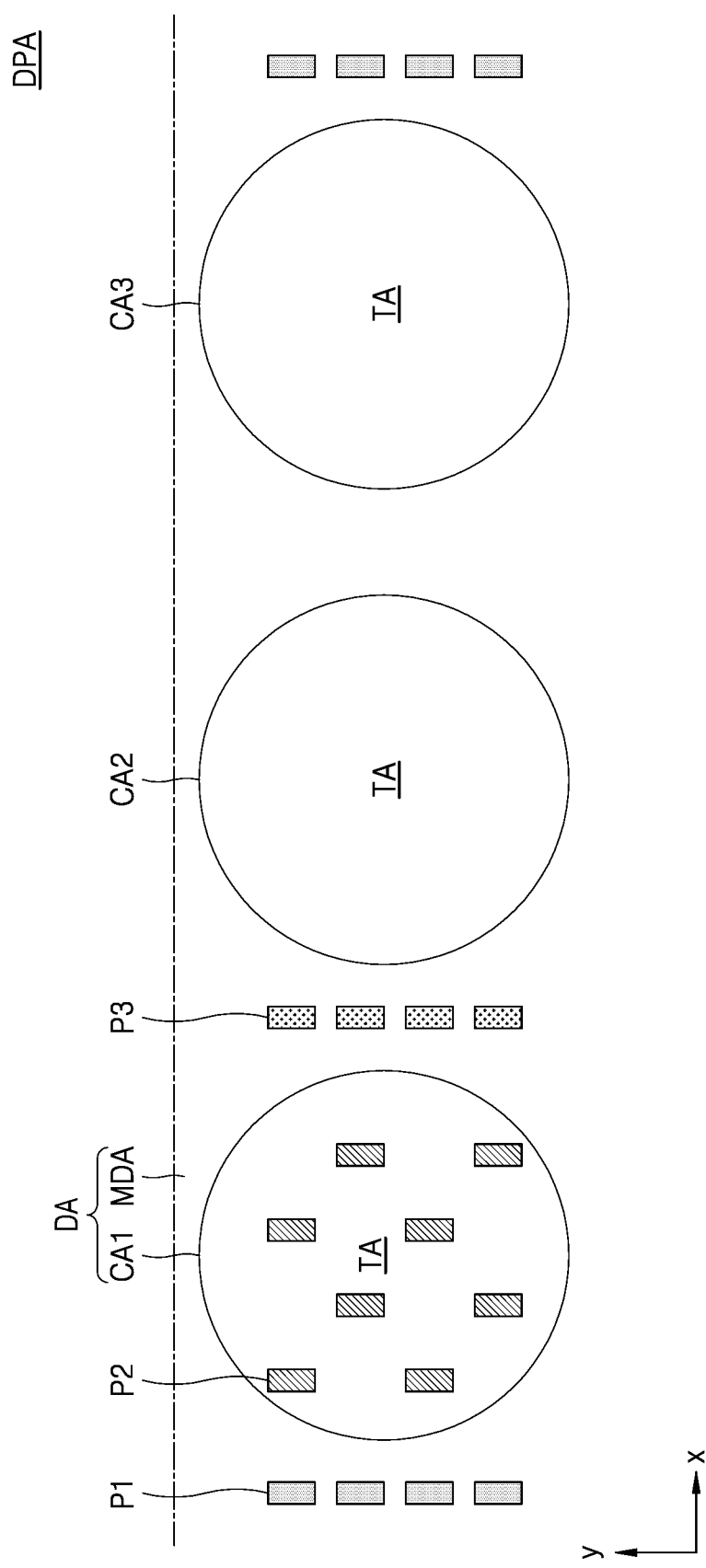
FIG. 19 is a schematic plan layout diagram illustrating a partial area of a display panel according to some example embodiments.

FIG. 19 is a schematic plan layout diagram illustrating a partial area of a display panel according to some example embodiments. The embodiments described with respect to FIG. 19 are different from the embodiments described with respect to FIG. 18 in that no subpixel is between the second component area CA2 and the third component area CA3. In FIG. 19, the same reference numerals as those in FIG. 18 refer to the same members, and a redundant description thereof will be omitted.

Referring to FIG. 19, according to some example embodiments, a subpixel may not be arranged between the second component area CA2 and the third component area CA3. Because no subpixel is between the second component area CA2 and the third component area CA3, the second component area CA2 and the third component area CA3 may be provided closer together.

According to some example embodiments, a subpixel may not be arranged between the first component area CA1 and the second component area CA2. Because no subpixel is between the first component area CA1 and the second component area CA2, the first component area CA1 and the second component area CA2 may be provided closer together.

Figure 20:
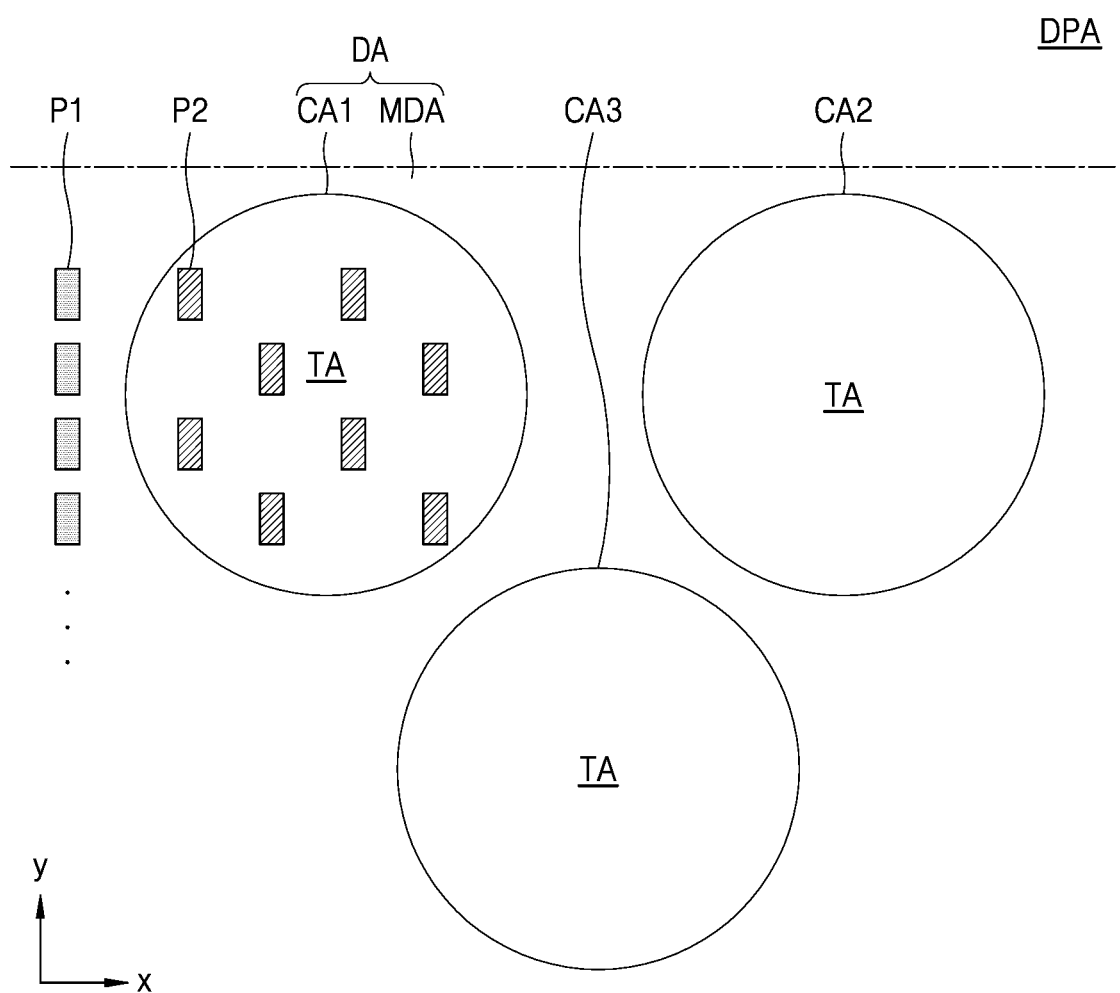
FIG. 20 is a schematic plan layout diagram illustrating a partial area of a display panel according to some example embodiments.

FIG. 20 is a schematic plan layout diagram illustrating a partial area of a display panel according to some example embodiments. The embodiments described with respect to FIG. 20 are different from the embodiments described with respect to FIG. 18 in that the third component area CA3 is located in a diagonal direction of the first component area CA1 and the second component area CA2. In FIG. 20, the same reference numerals as those in FIG. 18 refer to the same members, and some redundant description thereof may be omitted.

Referring to FIG. 20, the first component area CA1 and the second component area CA2 may be spaced apart from each other in the first direction (the x-direction). The third component area CA3 may be spaced apart from each of the first component area CA1 and the second component area CA2 in a diagonal direction. For example, the first component area CA1, the second component area CA2, and the third component area CA3 may form an inverted triangle shape.

According to some example embodiments, a camera may be in the first component area CA1 to correspond to the first component area CA1, and sensors requiring high resolution, such as a 3D IR sensor and a radar sensor, may be in the second component area CA2 and the third component area CA3 having a greater light transmittance than the first component area CA1.

According to some example embodiments, subpixels may be in the second component area CA2 and/or the third component area CA3. Also, subpixels may be between the first component area CA1 and the second component area CA2.

Figure 21:
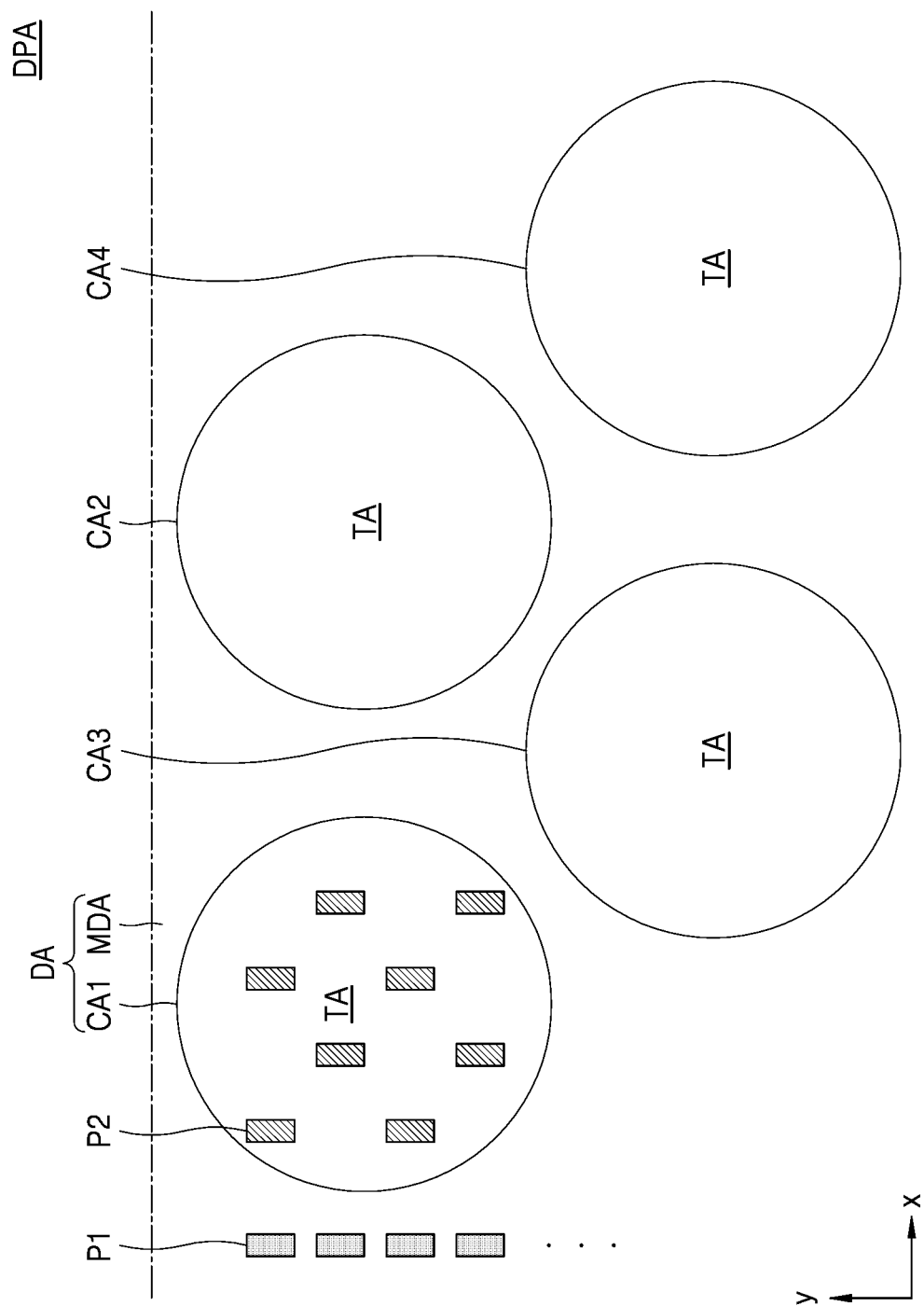
FIG. 21 is a schematic plan layout diagram illustrating a partial area of a display panel according to some example embodiments.
Figure 22:
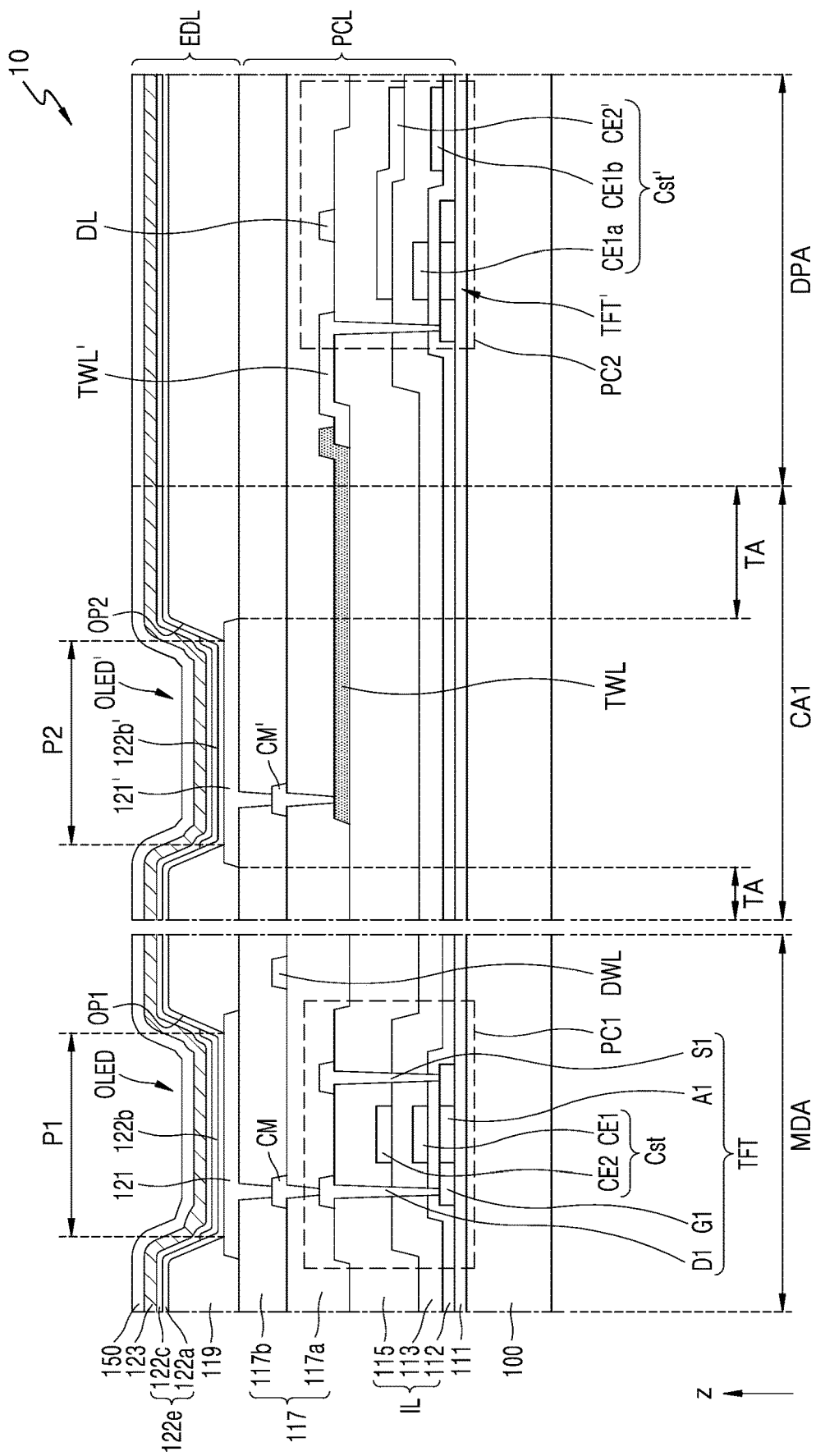
FIG. 22 is a schematic cross-sectional view illustrating a portion of a display panel, for example, a first component area, and a peripheral area, according to some example embodiments.

FIG. 21 is a schematic plan layout diagram illustrating a partial area of a display panel according to some example embodiments. The embodiments described with respect to FIG. 21 are different from the embodiments described with respect to FIG. 20 in that a fourth component area CA4 is further included. In FIG. 22, the same reference numerals as those in FIG. 20 refer to the same members, and some redundant description thereof may be omitted.

Referring to FIG. 21, the first component area CA1 and the second component area CA2 may be spaced apart from each other in the first direction (the x direction), and the third component area CA3 and the fourth component area CA4 may be spaced apart from each other in the first direction (the x direction).

The third component area CA3 may be in a diagonal direction of each of the first component area CA1 and the second component area CA2, and the fourth component area CA4 may be in a diagonal direction of the second component area CA2. For example, the first component area CA1, the second component area CA2, the third component area CA3, and the fourth component area CA4 may form a rhombus shape.

According to some example embodiments, a camera may be in the first component area CA1 to correspond to the first component area CA1, and sensors requiring high resolution, such as a 3D IR sensor and a radar sensor, may be in the second component area CA2 to the fourth component area CA4 having greater light transmittance than the first component area CA1.

According to some example embodiments, subpixels may be in the second component area CA2, the third component area CA3, and/or the fourth component area CA4. Further, subpixels may be between the first component area CA1 and the second component area CA2, and between the third component area CA3 and the fourth component area CA4.

FIG. 22 is a schematic cross-sectional view illustrating a portion of a display panel 10 and a portion of a main display area MDA, a first component area CA1, and a peripheral area DPA according to some example embodiments.

Referring to FIG. 22, a first subpixel P1 may be in the main display area MDA, and the first component area CA1 may include a second subpixel P2 and a transmission area TA. A first pixel circuit PC1 including a main thin-film transistor TFT and a main storage capacitor Cst, and a main organic light-emitting diode OLED as a display element connected to the first pixel circuit PC1 may be in the main display area MDA. An auxiliary organic light-emitting diode OLED' may be in the first component area CA1. A second pixel circuit PC2 including an auxiliary thin-film transistor TFT' and an auxiliary storage capacitor Cst' may be in the peripheral area DPA. Meanwhile, a connection wiring TWL connecting the second pixel circuit PC2 to the auxiliary organic light-emitting diode OLED' may be in the first component area CA1 and the peripheral area DPA.

According to some example embodiments, an organic light-emitting diode is used as a display element. However, according to some example embodiments, an inorganic light-emitting element or a quantum dot light-emitting element may be used as a display element.

A structure in which elements included in the display panel 10 are stacked will now be described. The display panel 10 may include a stack of a substrate 100, a buffer layer 111, a circuit layer PCL, and a display element layer EDL.

The substrate 100 may include an insulating material such as glass, quartz, or polymer resin. The substrate 100 may include a rigid substrate or a flexible substrate that is bendable, foldable, or rollable.

The buffer layer 111 may be on the substrate 100 to reduce or block the penetration of foreign materials, moisture, or ambient air from the bottom of the substrate 100 and may provide a flat surface on the substrate 100. The buffer layer 111 may include an inorganic material such as oxide or nitride, or an organic material, or an organic/inorganic composite, and may include a single-layer or multilayer structure of an inorganic material and an organic material. A barrier layer for blocking the penetration of ambient air may be further included between the substrate 100 and the buffer layer 111. In some embodiments, the buffer layer 111 may include silicon oxide ($SiO_2$) or silicon nitride ($SiN_x$).

The circuit layer PCL may be on the buffer layer 111 and may include the first and second pixel circuits PC1 and PC2, a first insulating layer 112, a second insulating layer 113, a third insulating layer 115, and a planarization layer 117. The first pixel circuit PC1 may include the main thin-film transistor TFT and the main storage capacitor Cst, and the second pixel circuit PC2 may include the auxiliary thin-film transistor TFT' and the auxiliary storage capacitor Cst'.

The main thin-film transistor TFT and the auxiliary thin-film transistor TFT' may be above the buffer layer 111. The main thin-film transistor TFT may include a first semiconductor layer A1, a first gate electrode G1, a first source electrode S1, and a first drain electrode D1. The main thin-film transistor TFT may be connected to the main organic light-emitting diode OLED to drive the main organic light-emitting diode OLED. The auxiliary thin-film transistor TFT' may be connected to the auxiliary organic light-emitting diode OLED' to drive the auxiliary organic light-emitting diode OLED'. The auxiliary thin-film transistor TFT' has a similar structure to a structure of the main thin-film transistor TFT, and thus, the description of the auxiliary thin-film transistor TFT' may be as the description of the main thin-film transistor TFT.

According to some example embodiments, the first semiconductor layer A1 may be on the buffer layer 111 and may include polysilicon. According to some example embodiments, the first semiconductor layer A1 may include amorphous silicon. According to some example embodiments, the first semiconductor layer A1 may include an oxide of at least one selected from the group consisting of indium (In), gallium (Ga), stannum (Sn), zirconium (Zr), vanadium (V), hafnium (Hf), cadmium (Cd), germanium (Ge), chromium (Cr), titanium (Ti), and zinc (Zn). The first semiconductor layer A1 may include a channel area, and a source area and a drain area doped with impurities.

The first insulating layer 112 may cover the first semiconductor layer A1. The first insulating layer 112 may include an inorganic insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), and hafnium oxide ($HfO_2$), or zinc oxide ($ZnO_2$). The first insulating layer 112 may include a single layer or multiple layers including the above inorganic insulating material.

The first gate electrode G1 may be above the first insulating layer 112 to overlap the first semiconductor layer A1. The first gate electrode G1 may include molybdenum (Mo), aluminum (Al), copper (Cu), titanium (Ti), or the like and may include a single layer or multiple layers. According to some example embodiments, the first gate electrode G1 may be a single molybdenum (Mo) layer.

The second insulating layer 113 may cover the first gate electrode G1. The second insulating layer 113 may include an inorganic insulating material such as silicon oxide ($SiO_2$), silicon nitride ($SiN_X$), silicon oxynitride ($SiO_XN_Y$), aluminum oxide ($Al_2O_3$), titanium oxide ($TiO_2$), tantalum oxide ($Ta_2O_5$), and hafnium oxide ($HfO_2$), or zinc oxide ($ZnO_2$). The second insulating layer 113 may include a single layer or multiple layers including the above inorganic insulating material.

An upper electrode CE2 of the main storage capacitor Cst and an upper electrode CE2' of the auxiliary storage capacitor Cst' may be above the second insulating layer 113.

In the main display area MDA, the upper electrode CE2 of the main storage capacitor Cst may overlap the first gate electrode G1 therebelow. The first gate electrode G1 and the first upper electrode CE2 overlapping each other with the second insulating layer 113 therebetween may constitute the main storage capacitor Cst. According to some example embodiments, the first gate electrode G1 may be a lower electrode CE1 of the main storage capacitor Cst. According to some example embodiments, the first gate electrode G1 and the lower electrode CE1 may be provided as independent and separate components.

In the peripheral area DPA, the upper electrode CE2' of the auxiliary storage capacitor Cst' may overlap a gate electrode of the auxiliary thin-film transistor TFT' therebelow. The gate electrode of the auxiliary thin-film transistor TFT' may be a first lower electrode CE1a of the auxiliary storage capacitor Cst'. The auxiliary storage capacitor Cst' may further include a second lower electrode CE1b, which is on the same layer as a layer on which the first lower electrode CE1a is arranged. The upper electrode CE2' of the auxiliary storage capacitor Cst' may overlap the first lower electrode CE1a and the second lower electrode CE1b. The first lower electrode CE1a and the second lower electrode CE1b may be electrically connected to each other. With this configuration, the capacitance of the auxiliary storage capacitor Cst' may be greater than that of the main storage capacitor Cst.

The upper electrodes CE2 and CE2' may each include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may each include a single layer or multiple layers of the above material.

The third insulating layer 115 may be formed to cover the upper electrodes CE2 and CE2'. The third insulating layer 115 may include silicon oxide ($SiO_2$), silicon nitride ($SiN_X$), silicon oxynitride ($SiO_XN_Y$), aluminum oxide ($Al_2O_3$), titanium oxide ($TiO_2$), tantalum oxide ($Ta_2O_5$), and hafnium oxide ($HfO_2$), or zinc oxide ($ZnO_2$). The third insulating layer 115 may include a single layer or multiple layers including the above inorganic insulating material.

Each of the first source electrode S1 and the first drain electrode D1 may be on the third insulating layer 115. The first source electrodes S1 and the first drain electrodes D1 may each include a conductive material including molybdenum (Mo), aluminum (Al), copper (Cu), titanium (Ti), or the like, and may include a single layer or multiple layers including the above material. According to some example embodiments, the first source electrode S1 and the first drain electrode D1 may have a Ti/Al/Ti multilayer structure.

The connection wiring TWL connected to the second pixel circuit PC2 may be above the third insulating layer 115. The connection wiring TWL may extend from the peripheral area DPA to the first component area CA1 so that the auxiliary organic light-emitting diode OLED' and the second pixel circuit PC2 are connected to each other. Also, the data line DL may be above the third insulating layer 115.

According to some example embodiments, the connection wiring TWL may be connected with an additional connection wiring TWL'. The additional connection wiring TWL' may be in the peripheral area DPA and connected to the second pixel circuit PC2, for example, the auxiliary thin-film transistor TFT'. The connection wiring TWL may be in the transmission area TA of the first component area CA1. The connection wiring TWL may include a different material from a material of the additional connection wiring TWL', wherein the connection wiring TWL is on the same layer as a layer on which the additional connection wiring TWL' is arranged. An end of the connection wiring TWL may cover an end of the additional connection wiring TWL'.

The additional connection wiring TWL' may include a conductive material including Mo, Al, Cu, Ti, or the like and may include a single layer or multiple layers including the above material. The additional connection wiring TWL' may include the same material as the data line DL.

The connection wiring TWL may include a transparent conductive material. For example, the connection wiring TWL may include a transparent conducting oxide (TCO). The connection wiring TWL may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO).

The additional connection wiring TWL' may have a greater conductivity than the connection wiring TWL. Because the additional connection wiring TWL' is in the peripheral area DPA, it is not necessary to secure light transmittance, and thus, a material having a less light transmittance but having a greater conductivity than the connection wiring TWL may be used.

According to some example embodiments, the additional connection wiring TWL' may be omitted. In this case, the connection wiring TWL may be directly electrically connected to the auxiliary thin-film transistor TFT'.

The planarization layer 117 may cover the first source electrode S1, the first drain electrode D1, and the connection wiring TWL. The planarization layer 117 may have a flat upper surface so that a first pixel electrode 121 and a second pixel electrode 121' located on the planarization layer 117 may be formed flat.

The planarization layer 117 may include an organic material or an inorganic material and may have a single-layer structure or a multilayer structure. The planarization layer 117 may include a first planarization layer 117a and a second planarization layer 117b. Thus, a conductive pattern such as a wiring may be formed between the first planarization layer 117a and the second planarization layer 117b, which may enable relatively high integration. Connection electrodes CM and CM' and a data connection line DWL may be above the first planarization layer 117a.

The planarization layer 117 may include benzocyclobutene (BIB), polyimide, hexamethyldisiloxane (HMDSO), a general-purpose polymer such as polymethyl methacrylate (PMMA) or polystyrene (PS), a polymer derivative having a phenol-based group, an acrylic polymer, an imide-based polymer, an aryl ether-based polymer, an amide-based polymer, a fluorinated polymer, a p-xylene-based polymer, or a vinyl alcohol-based polymer. Meanwhile, the planarization layer 117 may include an inorganic insulating material such as silicon oxide ($SiO_2$), silicon nitride ($SiN_X$), silicon oxynitride ($SiO_XN_Y$), aluminum oxide ($Al_2O_3$), titanium oxide ($TiO_2$), tantalum oxide ($Ta_2O_5$), and hafnium oxide ($HfO_2$), or zinc oxide ($ZnO_2$). When the planarization layer 117 is formed, after the planarization layer 117 is formed, chemical mechanical polishing may be performed on an upper surface of the layer to provide a flat upper surface thereon.

The first planarization layer 117a may cover the pixel circuits PC and PC'. The second planarization layer 117b may be on the first planarization layer 117a and may have a flat upper surface so that the first and second pixel electrodes 121 and 121' may be formed flat.

The main and auxiliary organic light-emitting diodes OLED and OLED' may be on the second planarization layer 117b. The first and second pixel electrodes 121 and 121' of the main and auxiliary organic light-emitting diodes OLED and OLED' may be connected to the pixel circuits PC and PC', respectively, through the connection electrodes CM and CM' each arranged on the first planarization layer 117a.

The first pixel electrode 121 and the second pixel electrode 121' may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). The first pixel electrode 121 and the second pixel electrode 121' may include a reflection layer including silver (Ag), magnesium (Mg), aluminum (Al), platinum (Pt), palladium (Pd), gold (Au), nickel (Ni), neodymium (Nd), iridium (Ir), chromium (Cr), or any compound thereof. For example, each of the first pixel electrode 121 and the second pixel electrode 121' may have a structure in which films including ITO/IZO, ZnO, or $In_2O_3$ are above/below the reflective film described above. In this case, the first pixel electrode 121 and the second pixel electrode 121' may have a stack structure of ITO/Ag/ITO.

In FIG. 22, the connection wiring TWL, the first pixel electrode 121, and the second pixel electrode 121' are on different layers, but may be on the same layer. When the connection wiring TWL, the first pixel electrode 121, and the second pixel electrode 121' are on the same layer, the connection wiring TWL, the first pixel electrode 121, and the second pixel electrode 121' may be formed in the same process by using a halftone mask.

For example, after stacking ITO/Ag/ITO in order, a halftone mask is used for a portion where the connection wiring TWL is to be formed, and thus, the first pixel electrode 121 and the second pixel electrode 121' may each have a stack structure of ITO/Ag/ITO, and the connection wiring TWL may include ITO. Through this, the resistance of the connection wiring TWL may be reduced while providing the transparent connection wiring TWL.

A pixel-defining layer 119 is located on the planarization layer 117 to cover an edge of each of the first pixel electrode 121 and the second pixel electrode 121', and may have a first opening OP1 and a second opening OP2 respectively exposing central portions of the first pixel electrode 121 and the second pixel electrode 121'. Sizes and shapes of emission areas of the main and auxiliary organic light-emitting diodes OLED and OLED', that is, the first and second sub-pixels P1 and P2, may be defined by the first opening OP1 and the second opening OP2, respectively.

The pixel-defining layer 119 may prevent an arc or the like from occurring on the edge of each of the first and second pixel electrodes 121 and 121' by increasing a distance between the edge of each the first and second pixel electrodes 121 and 121' and an opposite electrode 123 located over the first and second pixel electrodes 121 and 121'. The pixel-defining layer 119 may include an organic insulating material such as polyimide, polyamide, acrylic resin, BCB, HMDSO, or phenolic resin by using spin coating or the like.

A first emission layer 122b and a second emission layer 122b', which are formed to correspond to the first pixel electrode 121 and the second pixel electrode 121', respectively, may be located in the first opening OP1 and the second opening OP2 of the pixel-defining layer 119, respectively. The first emission layer 122b and the second emission layer 122b' may include a high molecular weight material or a low molecular weight material and may emit red, green, blue, or white light.

An organic functional layer 122e may be over and/or under the first emission layer 122b and the second emission layer 122b'. The organic functional layer 122e may include a first functional layer 122a and/or a second functional layer 122c. The first functional layer 122a or the second functional layer 122c may be omitted.

The first functional layer 122a may be under the first emission layer 122b and the second emission layer 122b'. The first functional layer 122a may include a single layer or multiple layers including an organic material. The first functional layer 122a may include a hole transport layer (HTL) having a single-layer structure. Alternatively, the first functional layer 122a may include a hole injection layer (HIL) and an HTL. The first functional layer 122a may be integrally formed to correspond to the main and auxiliary organic light-emitting diodes OLED and OLED' respectively included in the main display area MDA and the first component area CA1.

The second functional layer 122c may be above the first emission layer 122b and the second emission layer 122b'. The second functional layer 122c may include a single layer or multiple layers including an organic material. The second functional layer 122c may include an electron transport layer (ETL) and/or an electron injection layer (EIL). The second functional layer 122c may be integrally formed to correspond to the main and auxiliary organic light-emitting diodes OLED and OLED' respectively included in the main display area MDA and the first component area CA1.

The opposite electrode 123 may be above the second functional layer 122c. The opposite electrode 123 may include a conductive material having a low work function. For example, the opposite electrode 123 may include a (semi-)transparent layer including silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), or an alloy thereof. Alternatively, the opposite electrode 123 may further include a layer including ITO, IZO, ZnO, or $In_2O_3$, on the (semi-)transparent layer including the above material.

According to some example embodiments, the opposite electrode 123 may be integrally formed to correspond to the main and auxiliary organic light-emitting diodes OLED and OLED' respectively included in the main display area MDA and the first component area CA1. According to some example embodiments, the opposite electrode 123 may be patterned and formed above the second functional layer 122c. For example, the opposite electrode 123 may be patterned by forming a material included in the opposite electrode 123 on the entire surface of the substrate 100, and then removing a portion thereof corresponding to the transmission area TA through laser lift off. The opposite electrode 123 may be patterned through a metal self patterning (MSP) method, and the opposite electrode 123 may be patterned by depositing the opposite electrode 123 by using a fine metal mask (FMM).

The layers from the first pixel electrode 121 to the opposite electrode 123 formed in the main display area MDA may form the main organic light-emitting diode OLED. The layers from the second pixel electrode 121' to the opposite electrode 123' formed in the first component area CA1 may form the auxiliary organic light-emitting diode OLED'.

An upper layer 150 including an organic material may be on the opposite electrode 123. The upper layer 150 may protect the opposite electrode 123 and improve light extraction efficiency. The upper layer 150 may include an organic material having a greater refractive index than the opposite electrode 123. Alternatively, the upper layer 150 may be a stack of layers having different refractive indices. For example, the upper layer 150 may include a stack of a high refractive index layer/a low refractive index layer/a high refractive index layer. In this case, a refractive index of the high refractive index layer may be about 1.7 or more, and a refractive index of the low refractive index layer may be about 1.3 or less.

The upper layer 150 may further include lithium fluoride (LiF). Alternatively, the upper layer 150 may further include an inorganic insulating material such as silicon oxide ($SiO_2$), silicon nitride ($SiN_x$), and silicon oxynitride ($SiO_xN_y$).

Figure 23:
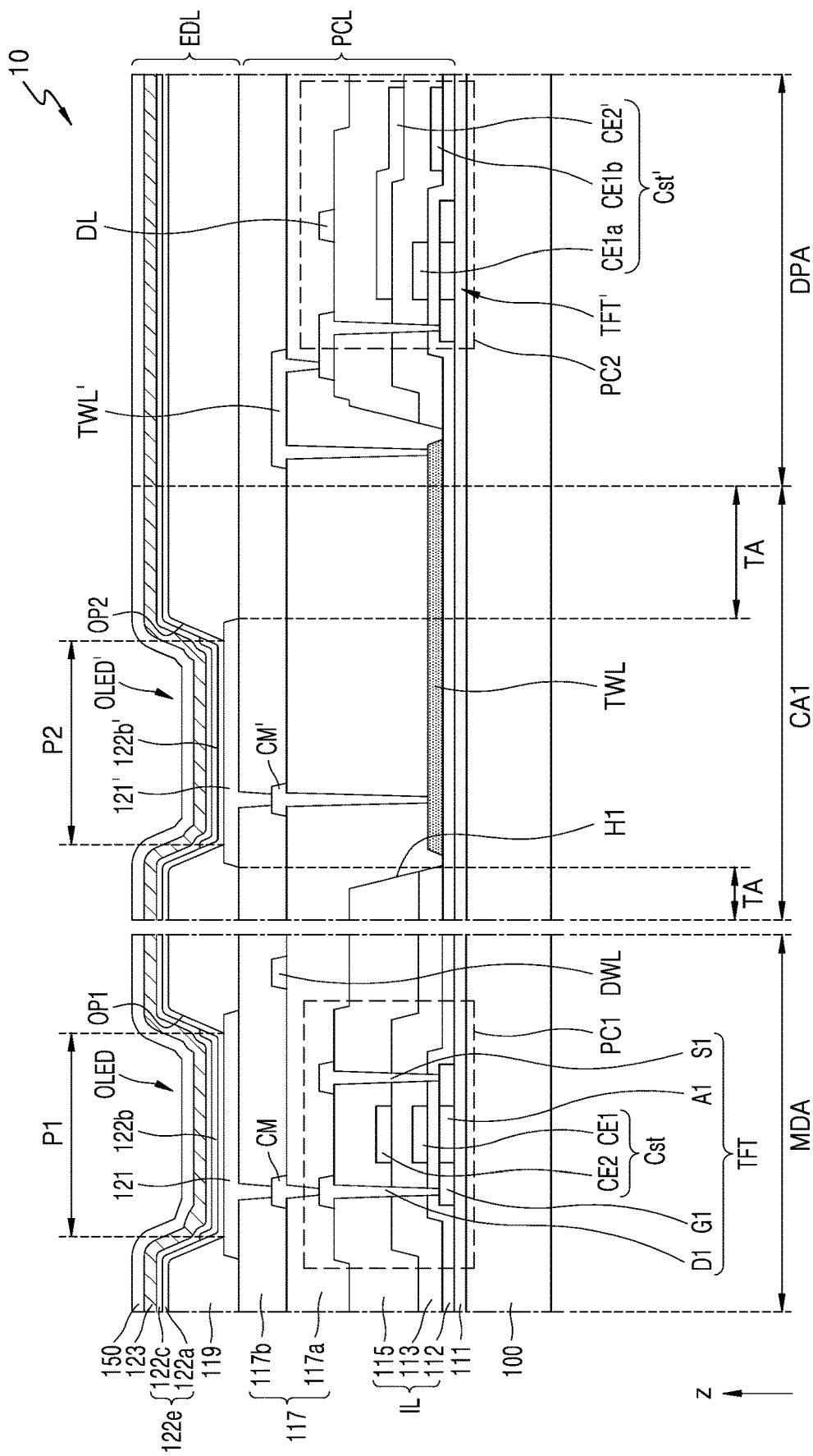
FIG. 23 is a schematic cross-sectional view illustrating a portion of a display panel according to some example embodiments.

FIG. 23 is a schematic cross-sectional view illustrating a portion of the display panel 10 according to some example embodiments. In FIG. 23, the same reference numerals as those in FIG. 22 refer to the same members, and a redundant description thereof will be omitted.

Referring to FIG. 23, the display panel 10 may include the main display area MDA, the first component area CA1, and the peripheral area DPA. The first subpixel P1 is in the main display area MDA, and the first component area CA1 may include the second subpixel P2 and the transmission area TA. The first pixel circuit PC1 including the main thin-film transistor TFT and the main storage capacitor Cst, and the main organic light-emitting diode OLED as a display element connected to the first pixel circuit PC1 may be in the main display area MDA. The auxiliary organic light-emitting diode OLED' may be in the first component area CA1. The second pixel circuit PC2 including the auxiliary thin-film transistor TFT' and the auxiliary storage capacitor Cst' may be in the peripheral area DPA. Meanwhile, the connection wiring TWL connecting the second pixel circuit PC2 to the auxiliary organic light-emitting diode OLED' may be in the component area CA and the peripheral area DPA.

According to some example embodiments, an inorganic insulating layer IL of the display panel 10 may include a hole corresponding to the first component area CA1.

For example, the first insulating layer 112, the second insulating layer 113, and the third insulating layer 115 may be collectively referred to as the inorganic insulating layer IL, and the inorganic insulating layer IL may have a first hole H1 corresponding to the transmission area TA. The first hole H1 may expose a portion of the upper surface of the buffer layer 111 or the substrate 100. The first hole H1 may be formed by overlapping an opening of the first insulating layer 112 and an opening of the second insulating layer 113, and an opening of the third insulating layer 115, which are formed to correspond to the first component area CA1, with one another. These openings may be separately formed through separate processes or may be simultaneously formed through the same process. When the openings are formed by using separate processes, an inner surface of the first hole H1 may not be smooth and may have a staircase-shaped step.

According to some example embodiments, the connection wiring TWL may be inside the first hole H1. The connection wiring TWL may be on the buffer layer 111 in the first component area CA1. Such a connection wiring TWL is connected via a contact hole to the additional connection wiring TWL' arranged on the first planarization layer 117a, and may be connected to the second pixel circuit PC2 through the additional connection wiring TWL'. The other end of the connection wiring TWL is connected to the connection electrode CM' via a contact hole, and the connection wiring TWL may be connected to the second pixel electrode 121' by the connection electrode CM'.

Figure 24:
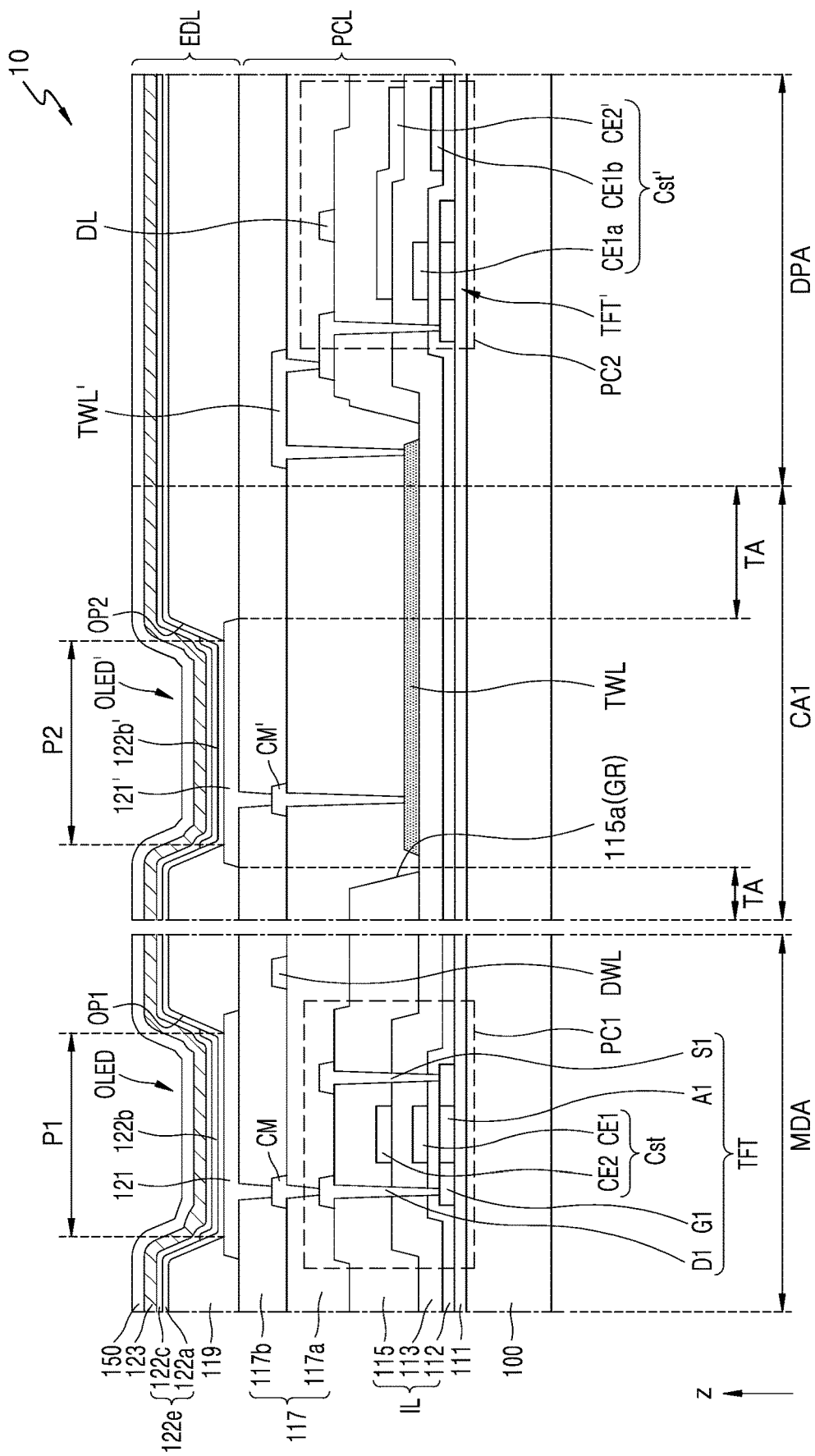
FIG. 24 is a schematic cross-sectional view illustrating a portion of a display panel according to some example embodiments.

FIG. 24 is a schematic cross-sectional view illustrating a portion of a display panel 10 according to some example embodiments. In FIG. 24, the same reference numerals as those in FIG. 22 refer to the same members, and a redundant description thereof will be omitted.

Referring to FIG. 24, the inorganic insulating layer IL of the display panel 10 may include a groove GR corresponding to the first component area CA1. For example, referring to the first insulating layer 112, the second insulating layer 113, and the third insulating layer 115 collectively as the inorganic insulating layer IL, the first insulating layer 112 and the second insulating layer 113 are continuously arranged over the first component area CA1, and the third insulating layer 115 may have an opening 115a corresponding to the first component area CA1. Alternatively, unlike illustrated, the first insulating layer 112 or the second insulating layer 113 may also have an opening corresponding to the first component area CA1. Accordingly, the groove GR may be provided by removing a portion of the inorganic insulating layer IL. Such a groove GR may be provided by removing a layer including silicon nitride ($SiN_x$) from the layers forming the inorganic insulating layer IL. Because the silicon nitride ($SiN_x$) has a high reflectance, the transmittance of the first component area CA1 may be improved by removing the layer including the silicon nitride ($SiN_x$).

According to some example embodiments, the connection wiring TWL may be on the second insulating layer 113 inside the groove GR. The connection wiring TWL may be connected to the second pixel circuit PC2 through the additional connection wiring TWL' arranged on the first planarization layer 117a.

Figure 25:
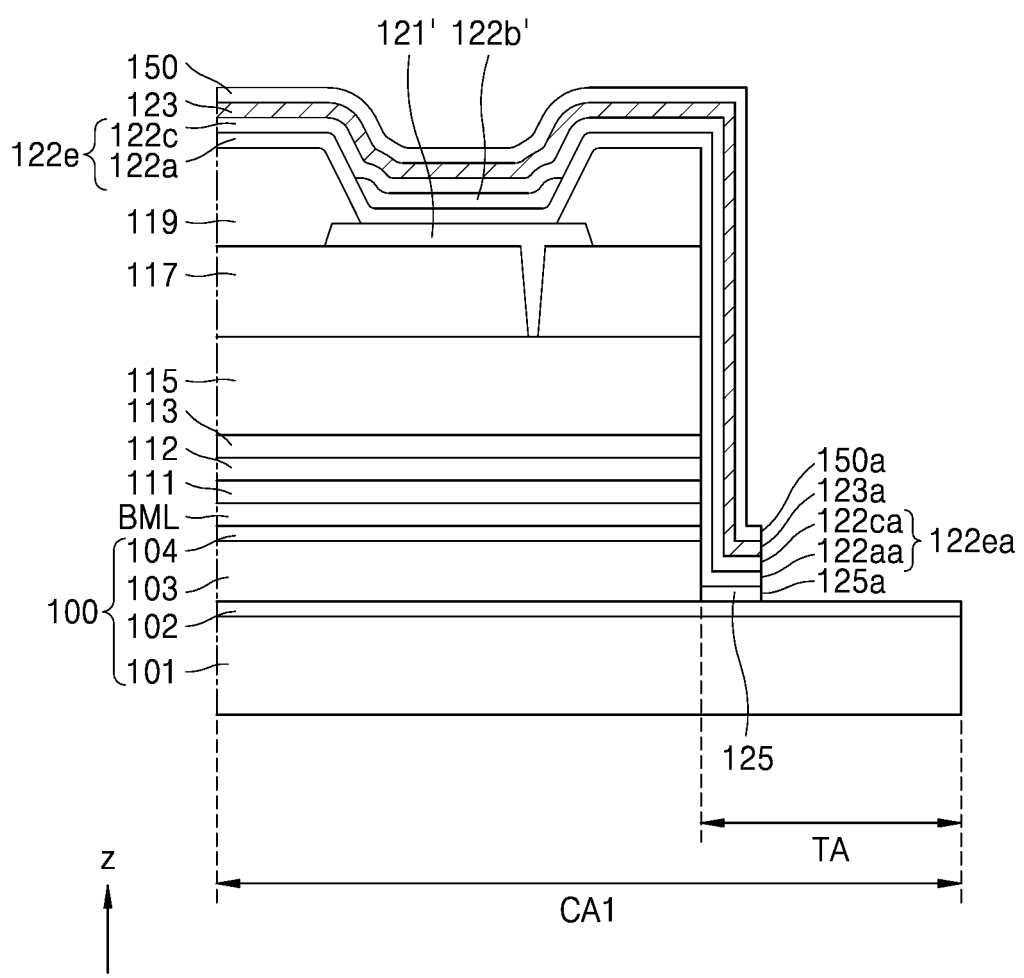
FIG. 25 is a schematic cross-sectional view illustrating a portion of a display panel according to some example embodiments.

FIG. 25 is a schematic cross-sectional view illustrating a portion of a display panel 10 according to some example embodiments. For example, FIG. 25 is a diagram illustrating a process of removing the organic functional layer 122e, the opposite electrode 123, and the upper layer 150 on the transmission area TA by laser lift off.

Referring to FIG. 25, the substrate 100 may include a first base layer 101, a first barrier layer 102, a second base layer 103, and a second barrier layer 104. The first base layer 101 and the second base layer 103 may include a polymer resin having high thermal resistance. For example, the first base layer 101 and the second base layer 103 may each include one or more materials selected from the group consisting of polyethersulfone, polyacrylate, polyether imide, polyethylene naphthalate, polyethylene terephthalate, polyphenylene sulfide, polyarylate, polyimide, polycarbonate, cellulose triacetate, cellulose acetate propionate, and polyarylene ethersulfone. For example, the first base layer 101 and the second base layer 103 may each include polyimide. The first barrier layer 102 and the second barrier layer 104 may each include one material from among silicon nitride ($SiN_x$), silicon oxide ($SiO_x$), aluminum oxide ($Al_2O_3$), and zirconium oxide ($Zr_2O_3$). The first barrier layer 102 and the second barrier layer 104 may block the penetration of ambient air.

A bottom metal layer BML may be on the substrate 100. For example, the bottom metal layer BML may be on the second barrier layer 104. The buffer layer 111, the first insulating layer 112, the second insulating layer 113, the third insulating layer 115, and the planarization layer 117 may be sequentially arranged on the bottom metal layer BML. A thin-film transistor may be between the insulating layers and the planarization layers.

The second pixel electrode 121' and the pixel-defining layer 119 may be on the planarization layer 117, and the organic functional layer 122e including the first functional layer 122a and the second functional layer 122c, the opposite electrode 123, and the upper layer 150 may be on the second pixel electrode 121'.

According to some example embodiments, the organic functional layer 122e, the opposite electrode 123, and the upper layer 150, which are on the transmission area TA, may be removed using a sacrificing layer 125. For example, the organic functional layer 122e, the opposite electrode 123, and the upper layer 150 formed on the transmission area TA along with the sacrificial layer 125 may be removed through laser lift off by using the bottom metal layer BML as a mask. An end 123a of the opposite electrode 123 may coincide with at least one of an end 125a of the sacrificing layer 125, an end 122ea of the organic functional layer 122e, or an end 150a of the upper layer 150. At this time, the sacrificing layer 125 may include silver (Ag) used to form the second pixel electrode 121', and a thickness of the bottom metal layer BML may be about 2,000 angstroms (Å) to about 3,000 angstroms (Å).

Figure 26:
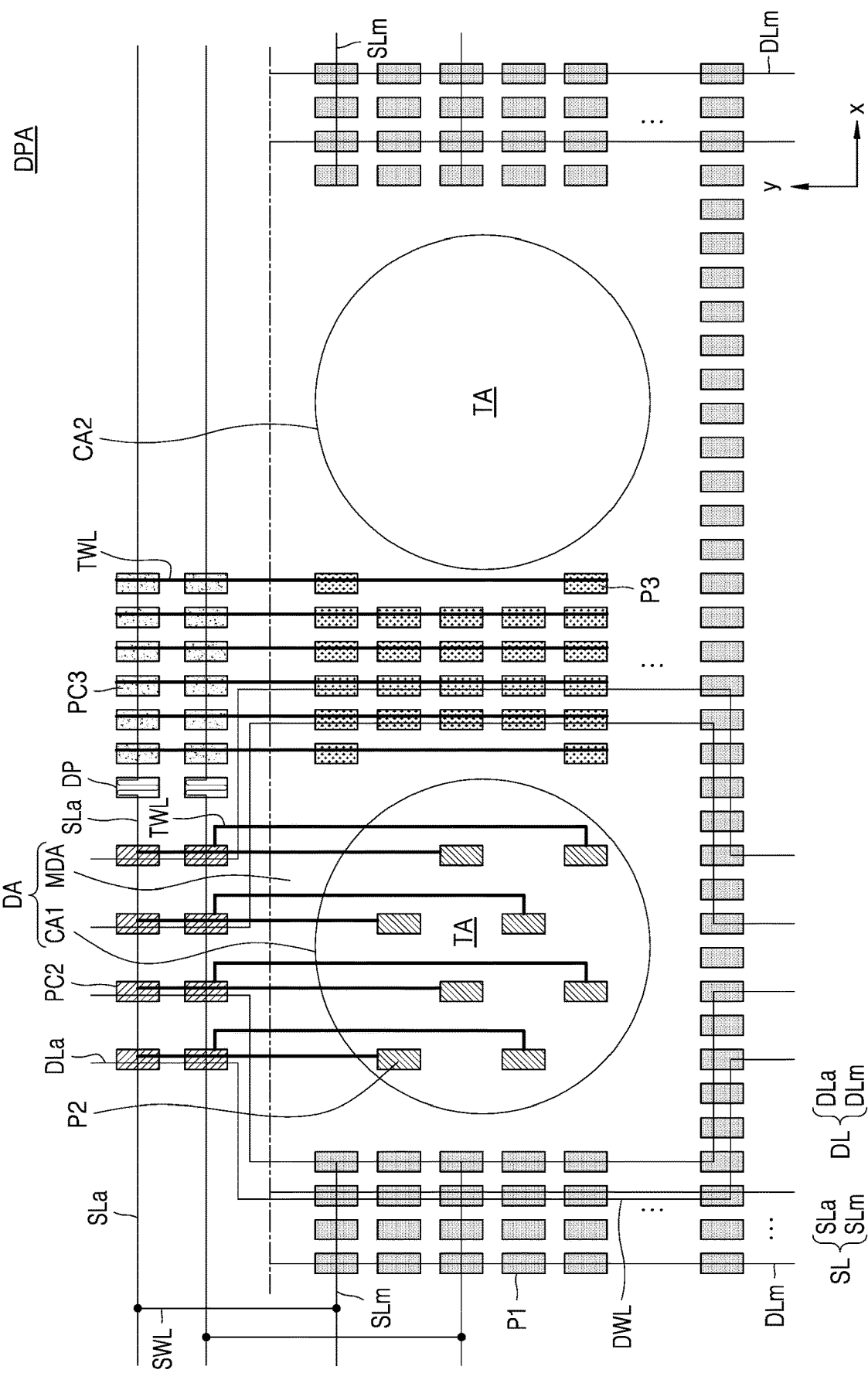
FIG. 26 is a schematic plan layout diagram illustrating a partial area of a display panel according to some example embodiments.

FIG. 26 is a schematic plan layout diagram illustrating a partial area of a display panel according to some example embodiments. The embodiments described with respect to FIG. 26 are different from the embodiments described with respect to FIG. 5 in that a signal line applied to the dummy subpixel DP is in a zigzag shape. In FIG. 26, the same reference numerals as those in FIG. 5 refer to the same members, and some redundant description thereof may be omitted.

Referring to FIG. 26, signal lines applied to the dummy subpixel DP may be provided in a zigzag shape. In more detail, the auxiliary scan line SLa applied to the dummy subpixel DP may be in a zigzag shape.

By providing the signal line applied to the dummy subpixel DP in a zigzag shape, a signal delay is prevented, and the luminance difference between subpixels not arranged on the same row or column as the first and second component areas CA1 and CA2 and subpixels arranged on the same row or column as the first and second component areas CA1 and CA2 may be prevented, minimized, or reduced.

FIG. 27A to 27D are schematic cross-sectional views each illustrating a partial area of a display panel according to some example embodiments. For example, FIGS. 27A to 27D are cross-sectional views each illustrating a stack structure of the dummy subpixel DP.

Figure 27A:
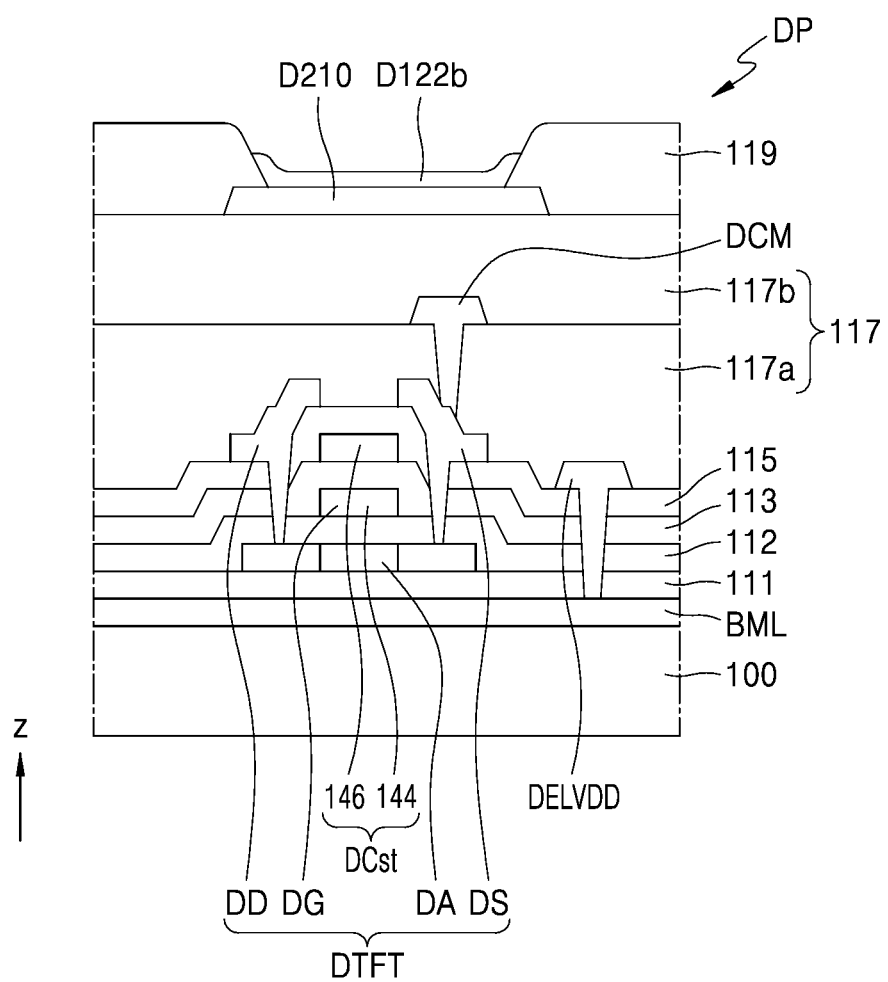
FIG. 27A to 27D are schematic cross-sectional views each illustrating a portion of a display panel according to some example embodiments.

Referring to FIG. 27A, the dummy subpixel DP may include a dummy thin-film transistor DAFT and a dummy storage capacitor DCst. The dummy thin-film transistor DTFT may include a dummy semiconductor layer DA, a dummy gate electrode DG, a dummy drain electrode DD, and a dummy source electrode DS. The dummy storage capacitor DCst may include a dummy lower electrode 144 and a dummy upper electrode 146. In addition, the dummy subpixel DP may include a dummy driving voltage DELVDD connected to the bottom metal layer BML, and a dummy connection electrode DCM connected to the dummy drain electrode DD or dummy source electrode DS.

The dummy subpixel DP may include a dummy pixel electrode D210 on the dummy connection electrode DCM, and a dummy emission layer D122b. However, the dummy connection electrode DCM and the dummy pixel electrode D210 of the dummy subpixel DP may not be electrically connected to each other.

Therefore, because the dummy connection electrode DCM and the dummy pixel electrode D210 are not electrically connected to each other, the dummy subpixel DP may not emit light, even when actual signals are applied to the dummy subpixel DP.

Figure 27B:
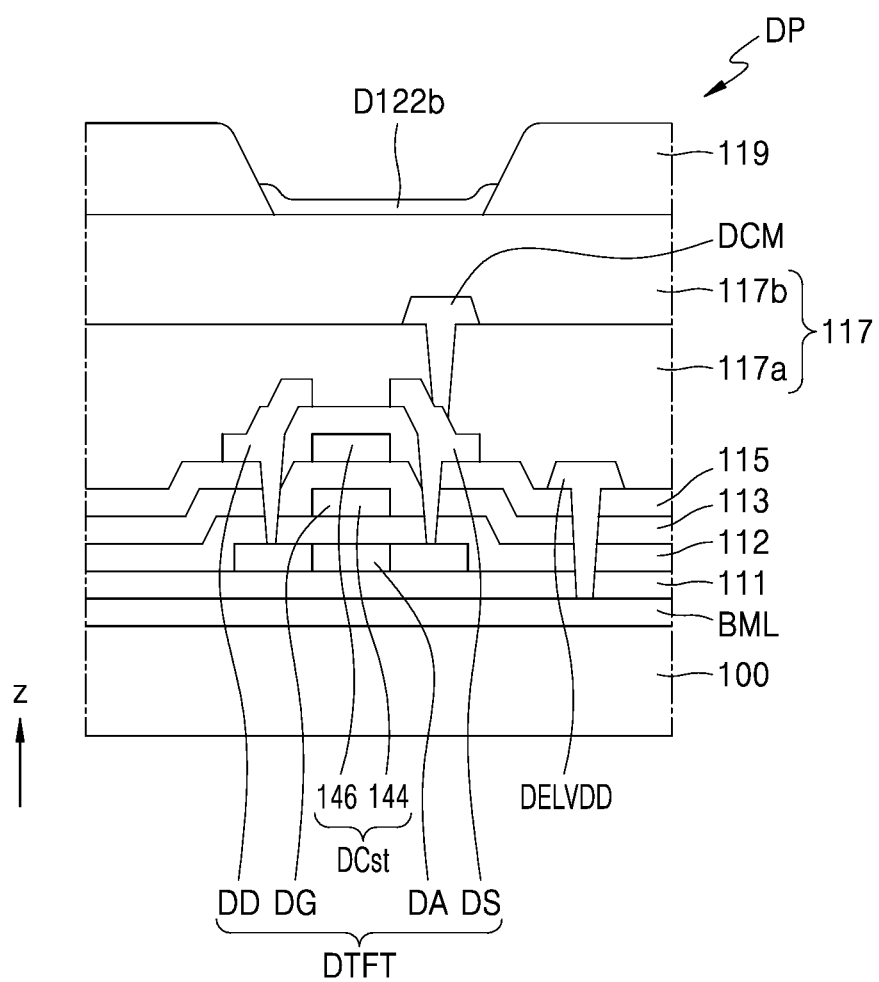
Figure 27C:
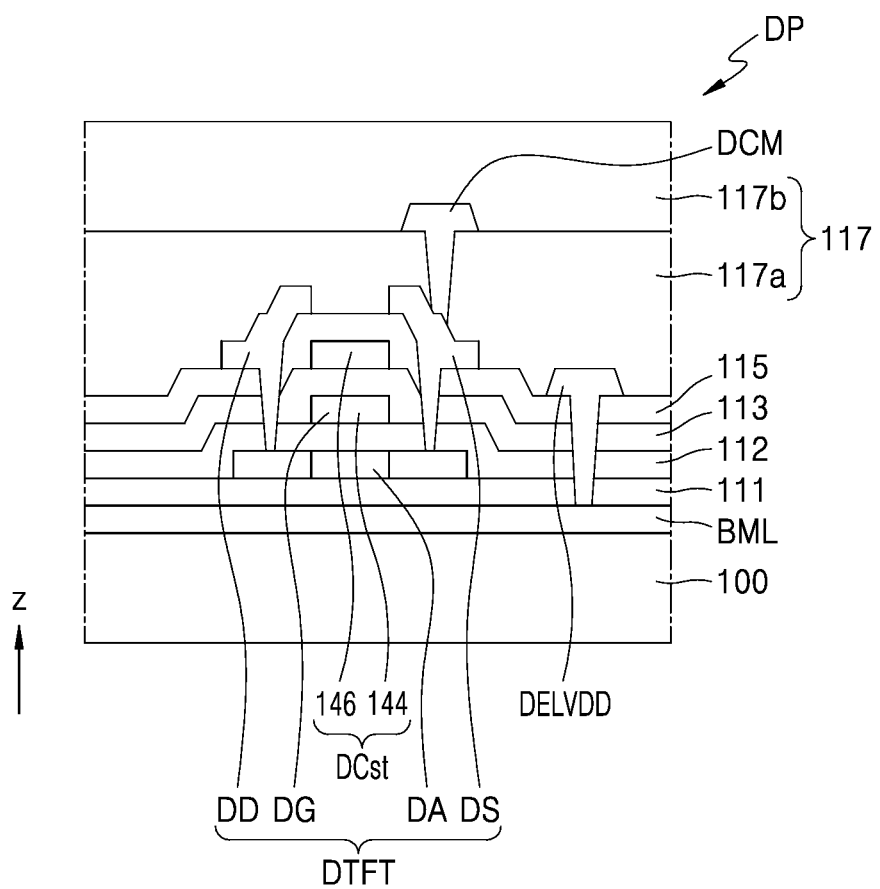
Figure 27D:
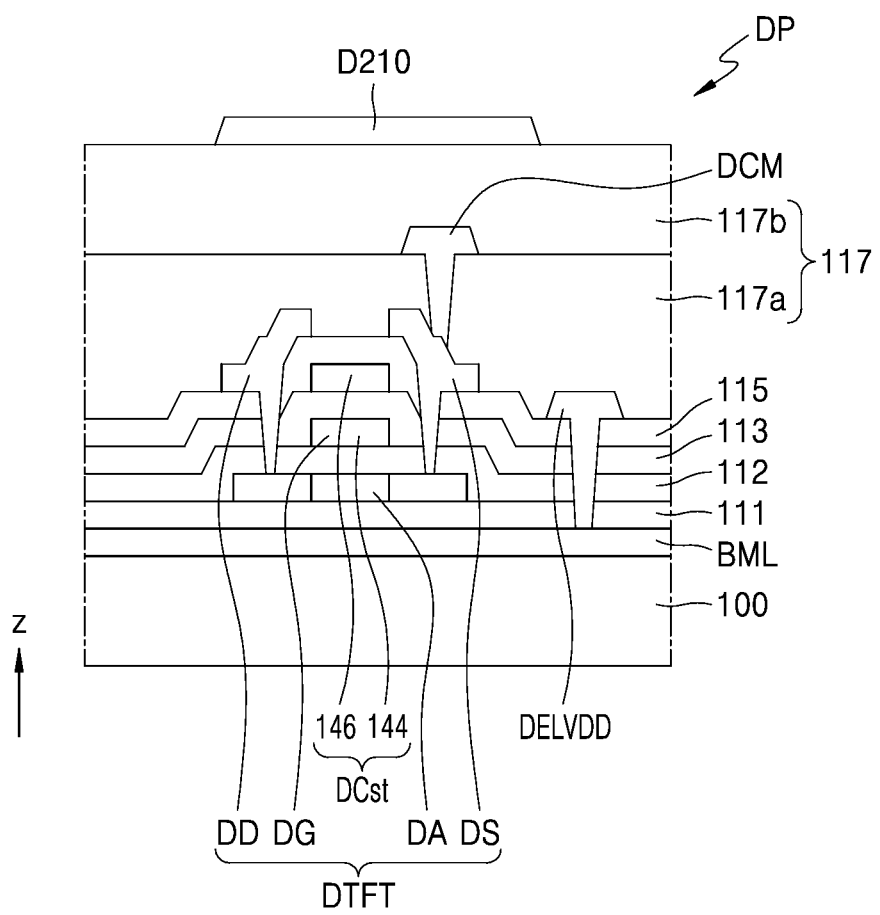

In FIG. 27A, the dummy subpixel DP includes the dummy thin-film transistor DTFT, the dummy storage capacitor DCst, the dummy pixel electrode D210, and the dummy emission layer D122b. However, as shown in FIG. 27B, the dummy subpixel DP may not include the dummy pixel electrode D210 in the structure shown in FIG. 27A. As shown in FIG. 27C, the dummy subpixel DP may not include the dummy pixel electrode D210 and the dummy emission layer D122b in the structure as shown in FIG. 27A. As shown in FIG. 27D, the dummy subpixel DP may not include the dummy emission layer D122b in the structure as shown in FIG. 27A.

Figure 28:
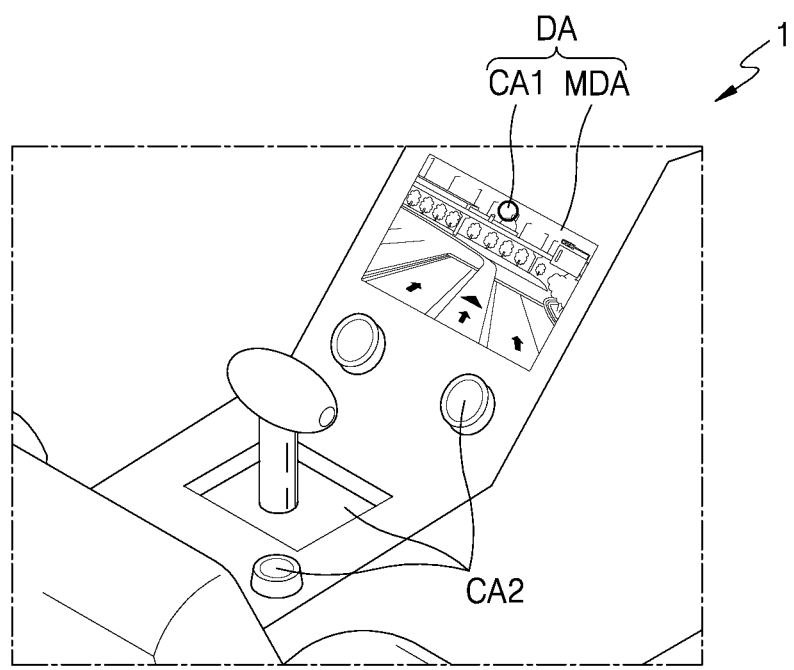
FIGS. 28 and 29 are perspective views each illustrating a display apparatus in use according to some example embodiments.
Figure 29:
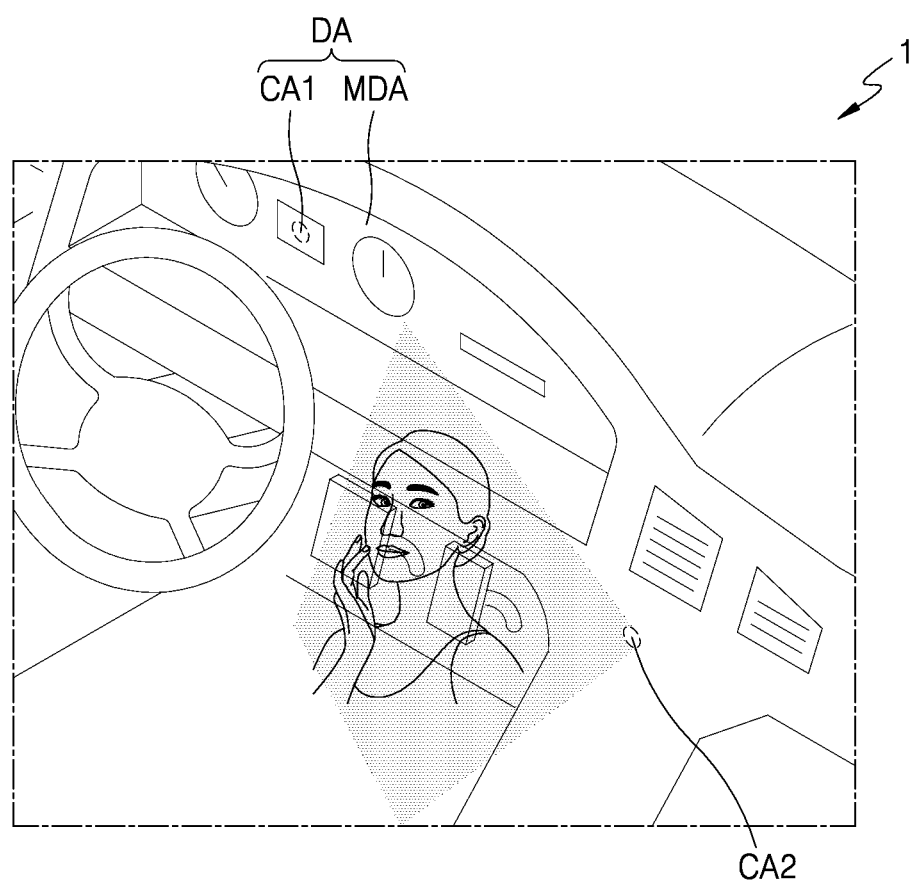

FIGS. 28 and 29 are perspective views each illustrating a display apparatus in use according to some example embodiments. For example, FIGS. 28 and 29 are perspective views each illustrating a display apparatus 1 included in a vehicle.

Referring to FIG. 28, the display apparatus 1 according to some example embodiments may be used as a display apparatus for a vehicle. For example, the display apparatus 1 may include a display area DA that includes a main display area MDA in which first subpixels are arranged, and a first component area CA1 in which second subpixels are arranged. In addition, a second component area CA2 where no subpixel is arranged may be at locations of a gear transmission, a sound control button, an emergency flashing button. In this case, because subpixels are in the main display area MDA and the first component area CA1, the main display area MDA and the first component area CA1 may display images individually or together. For example, the main display area MDA may display a navigation screen, and the first component area CA1 may be on one side of the main display area MDA to display the navigation screen together with the main display area MDA. In addition, the main display area MDA and the first component area CA1 may display not only the navigation screen, but also weather, buttons, and interior/exterior environments of the vehicle, individually or together.

In this case, components such as a camera may be under the first component area CA1, and sensors requiring high resolution may be under the second component area CA2.

Referring to FIG. 29, an instrument panel of a vehicle may be a digital instrument panel. The digital instrument panel is provided as the display apparatus 1 including the display area DA, and may provide information on a vehicle speed and a current state to a user through an image.

According to some example embodiments, the display apparatus 1 may include the display area DA for displaying an image. The display area DA may include a main display area MDA and a first component area CA1 below which a camera or the like is arranged.

The display apparatus 1 may recognize a face shape, mood, and facial expressions of the driver or passenger through a camera below the first component area CA1.

In addition, the display apparatus 1 may include a second component area CA2 below which a 3D image sensor is arranged. The display apparatus 1 may output a 3D image through the 3D image sensor in the second component area CA2.

According to some example embodiments, no pixel circuit is in a component area of a display panel and a display apparatus having the display panel, and thus, a larger transmission area may be secured, and the transmittance may be improved. However, the scope of the disclosure is not limited by the effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display panel comprising:
   a substrate comprising a main display area, a first component area, a second component area, and a peripheral area;
   a first subpixel on the main display area, and a first pixel circuit connected to the first subpixel;
   a second subpixel on the first component area;
   a second pixel circuit spaced apart from the second subpixel; and
   a connection wiring connecting the second subpixel to the second pixel circuit,
   wherein the second pixel circuit is between the first component area and the second component area.

2. The display panel of claim 1, wherein the second pixel circuit is in the peripheral area.

3. The display panel of claim 1, wherein the connection wiring comprises a transparent conductive material.

4. The display panel of claim 3, further comprising an additional connection wiring connecting the connection wiring to the second pixel circuit, wherein the additional connection wiring includes a material different from a material of the connection wiring.

5. The display panel of claim 1, wherein the first subpixel and the second subpixel are configured to emit a same color of light, and
   a size of the second subpixel is greater than a size of the first subpixel.

6. A display panel comprising:
   a substrate comprising a main display area, a first component area, a second component area, and a peripheral area;
   a first subpixel on the main display area, and a first pixel circuit connected to the first subpixel;
   a second subpixel on the first component area;
   a second pixel circuit spaced apart from the second subpixel;
   a connection wiring connecting the second subpixel to the second pixel circuit; and
   a third subpixel between the first component area and the second component area.

7. The display panel of claim 6, wherein
   the third subpixel is connected to a third pixel circuit in the peripheral area.

8. The display panel of claim 1, further comprising:
   a main scan line extending in a first direction, and
   a scan connection line connected to the main scan line.

9. The display panel of claim 8, wherein the scan connection line surrounds one side of the first component area.

10. The display panel of claim 8, wherein the scan connection line is in the peripheral area.

11. The display panel of claim 1, wherein the first subpixel comprises a first pixel electrode and a first emission layer, and the second subpixel comprises a second pixel electrode and a second emission layer.

12. The display panel of claim 11, further comprising:
    an opposite electrode on each of the first emission layer and the second emission layer; and
    an upper layer on the opposite electrode,
    wherein an end of the opposite electrode and an end of the upper layer coincide with each other.

13. The display panel of claim 11, wherein the first pixel electrode or the second pixel electrode and the connection wiring are formed by a same process.

14. The display panel of claim 1, further comprising a bottom metal layer on the first component area.

15. The display panel of claim 14, further comprising a dummy subpixel is the peripheral area or the first component area and the second component area.

16. The display panel of claim 1, wherein the substrate further comprises a third component area.

17. A display apparatus comprising:
    a display panel comprising a substrate, the substrate comprising a main display area, a first component area, a second component area, and a peripheral area;
    a first component below the display panel corresponding to the first component area; and
    a second component below the display panel corresponding to the second component area,
    wherein the display panel comprises:
    a first subpixel on the main display area, and a first pixel circuit connected to the first subpixel;
    a second subpixel on the first component area;
    a second pixel circuit spaced apart from the second subpixel; and
    a connection wiring connecting the second subpixel to the second pixel circuit,
    wherein the second pixel circuit is between the first component area and the second component area.

18. The display apparatus of claim 17, wherein the first component and the second component each comprise at least one of a proximity sensor, an illuminance sensor, an RGB sensor, an infrared sensor, a fingerprint recognition sensor, an ultrasonic sensor, an optical sensor, a microphone, an environmental sensor, a chemical sensor, or a radar sensor.

19. The display apparatus of claim 18, wherein the substrate further comprises a third component area, and the display apparatus further comprises a third component corresponding to the third component area.

* * * * *